US012324309B2

(12) United States Patent
Shin et al.

(10) Patent No.: US 12,324,309 B2
(45) Date of Patent: Jun. 3, 2025

(54) ELECTRONIC DEVICE INCLUDING CAMERA MODULE

(71) Applicant: Samsung Electronics Co., Ltd., Suwon-si (KR)

(72) Inventors: Sungyoung Shin, Suwon-si (KR); Minsuk Uhm, Suwon-si (KR); Dongseop Lee, Suwon-si (KR); Haechang Lee, Suwon-si (KR); Byungduk Yang, Suwon-si (KR); Kwangduk Kim, Suwon-si (KR); Donghyun Yeom, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 460 days.

(21) Appl. No.: 17/733,471

(22) Filed: Apr. 29, 2022

(65) Prior Publication Data

US 2022/0320474 A1    Oct. 6, 2022

Related U.S. Application Data

(63) Continuation of application No. PCT/KR2022/004538, filed on Mar. 30, 2022.

(30) Foreign Application Priority Data

Apr. 5, 2021 (KR) .......... 10-2021-0043957
Nov. 16, 2021 (KR) .......... 10-2021-0157621

(51) Int. Cl.
*H10K 50/86*    (2023.01)
*H10K 50/818*   (2023.01)
(Continued)

(52) U.S. Cl.
CPC ......... *H10K 50/865* (2023.02); *H10K 50/818* (2023.02); *H10K 59/122* (2023.02); *H10K 59/126* (2023.02)

(58) Field of Classification Search
CPC .. H10K 50/865; H10K 50/818; H10K 59/122; H10K 59/126; H10K 59/131;
(Continued)

(56) References Cited

U.S. PATENT DOCUMENTS 9,559,124 B2    1/2017  Park et al.
2003/0227021 A1*  12/2003  Yamazaki ............ H10K 59/878
                                                      438/22
(Continued)

FOREIGN PATENT DOCUMENTS

CN    110189639 A    8/2019
CN    110867476 A    3/2020
(Continued)

OTHER PUBLICATIONS

International Search Report with Written Opinion and English translation dated Jun. 29, 2022; International Appln. No. PCT/KR2022/004538.
(Continued)

*Primary Examiner* — Suberr L Chi
*Assistant Examiner* — William C. Trice, III
(74) *Attorney, Agent, or Firm* — Jefferson IP Law, LLP

(57) ABSTRACT

An electronic device is provided. The electronic device includes a display panel and a camera module arranged under the display panel. The display panel may include a first area including a first plurality of pixels having a first pixel density and overlapping the camera module, a second area including a second plurality of pixels having a second pixel density greater than the first pixel density, a first light reflection blocking layer arranged in all or at least a portion of the first area, and a plurality of transparent wiring lines arranged under first organic light-emitting diodes arranged in the first area. The first light reflection blocking layer may be arranged to overlap lower portions of the first organic
(Continued)

light-emitting diodes arranged in the first area. The first light reflection blocking layer may be arranged between anode electrodes of the first organic light-emitting diodes and the plurality of transparent wiring lines.

20 Claims, 17 Drawing Sheets

(51) Int. Cl.
  *H10K 59/122* (2023.01)
  *H10K 59/126* (2023.01)

(58) Field of Classification Search
  CPC .......... H10K 59/80518; H10K 59/878; H10K 59/8792; H10K 59/65
  See application file for complete search history.

(56) References Cited

U.S. PATENT DOCUMENTS

| | | | |
|---|---|---|---|
| 2004/0246432 A1 | 12/2004 | Tsuchiya et al. | |
| 2018/0047798 A1* | 2/2018 | Abe | H10K 59/38 |
| 2018/0183008 A1* | 6/2018 | Song | H10K 59/121 |
| 2018/0269267 A1 | 9/2018 | Ohchi | |
| 2019/0148470 A1 | 5/2019 | Takagi | |
| 2020/0227494 A1 | 7/2020 | Bae et al. | |
| 2020/0394964 A1 | 12/2020 | Hyun et al. | |
| 2021/0074780 A1 | 3/2021 | Woo et al. | |
| 2021/0159286 A1* | 5/2021 | Ma | H10K 59/131 |
| 2021/0202885 A1* | 7/2021 | Cai | H10K 59/80516 |
| 2021/0211595 A1 | 7/2021 | Yamamoto et al. | |
| 2021/0296419 A1 | 9/2021 | Xu et al. | |
| 2021/0327958 A1 | 10/2021 | Li et al. | |

FOREIGN PATENT DOCUMENTS

| | | |
|---|---|---|
| JP | 2012-114197 A | 6/2012 |
| JP | 2019-213151 A | 12/2019 |
| KR | 10-2005-0084497 A | 8/2005 |
| KR | 10-1451293 B1 | 10/2014 |
| KR | 10-2018-0056646 A | 5/2018 |
| KR | 10-2019-0015207 A | 2/2019 |
| KR | 10-2020-0089380 A | 7/2020 |
| KR | 10-2020-0144193 A | 12/2020 |
| KR | 10-2021-0029431 A | 3/2021 |
| KR | 10-2021-0029618 A | 3/2021 |
| WO | 2020/233286 A1 | 11/2020 |

OTHER PUBLICATIONS

Extended European Search Report dated May 10, 2024; European Appln. No. 22784848.8-1211 / 4276909 PCT/KR2022004538.
Korean Office Action dated Jan. 24, 2025, issued in Korean Application No. 10-2021-0157621.

* cited by examiner

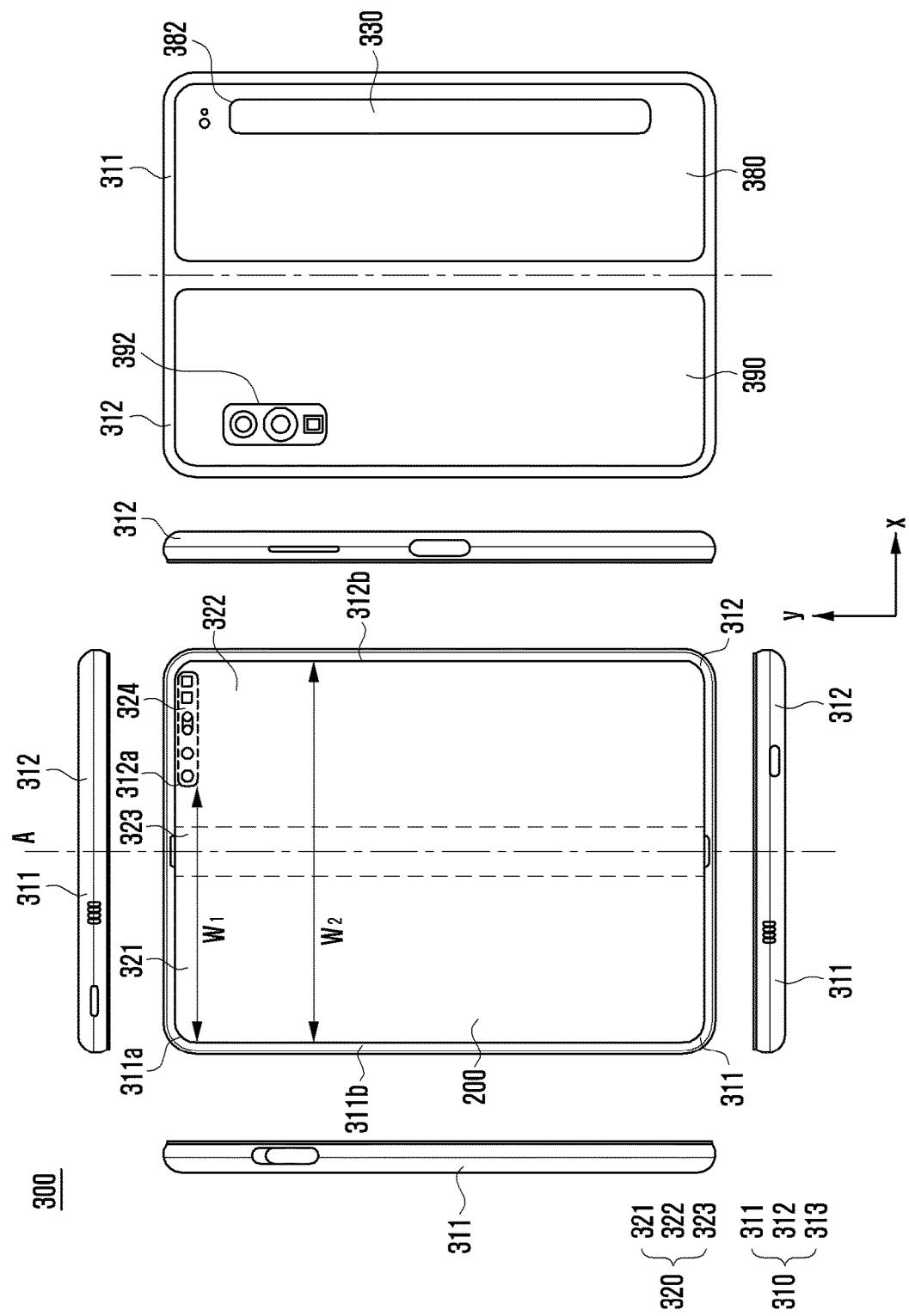

ELECTRONIC DEVICE INCLUDING CAMERA MODULE

CROSS-REFERENCE TO RELATED APPLICATION(S)

This application is a continuation application, claiming priority under § 365(c), of an International application No. PCT/KR2022/004538, filed on Mar. 30, 2022, which is based on and claims the benefit of a Korean patent application number 10-2021-0043957, filed on Apr. 5, 2021, in the Korean Intellectual Property Office, and of a Korean patent application number 10-2021-0157621, filed on Nov. 16, 2021, the disclosure of each of which is incorporated by reference herein in its entirety.

TECHNICAL FIELD

The disclosure relates to an electronic device including a camera module. More particularly, the disclosure relates to an electronic device including a camera module arranged on a rear surface of (e.g., under) a display.

BACKGROUND ART

Electronic devices (e.g., mobile electronic devices) are being released in various sizes according to functions and users' preferences, and may include a large-screen touch display for securing wide visibility and convenience of operation. An electronic device may include at least one camera module (e.g., an image sensor). For example, the electronic device may include at least one camera module arranged around a display or through at least a portion of the display. Various techniques for increasing the amount of light incident on the camera module while arranging the camera module on the rear surface of (e.g., under) the display have been proposed.

The above information is presented as background information only to assist with an understanding of the disclosure. No determination has been made, and no assertion is made, as to whether any of the above might be applicable as prior art with regard to the disclosure.

DISCLOSURE

Technical Problem

An electronic device to which an under-display camera (UDC) is applied may include a pixel area of an organic light-emitting diode (OLED) display and a peripheral area adjacent to the pixel area. A plurality of pixels capable of displaying an image may be regularly arranged in the pixel area, and a plurality of wiring lines may be disposed in a peripheral area. When an optical sensor, such as a camera module, is arranged on the rear surface of the OLED display, light incident on the inside of the OLED display may be reflected and may be incident on the camera module. When the reflected light is incident on the camera module, a light flare may occur. Aspects of the disclosure are to address at least the above-mentioned problems and/or disadvantages and to provide at least the advantages described below. Accordingly, an aspect of the disclosure is to provide an electronic device including a camera module capable of preventing light incident on the inside of a display panel from being incident on the camera module to prevent a light flare from occurring.

Additional aspects will be set forth in part in the description which follows and, in part, will be apparent from the description, or may be learned by practice of the presented embodiments.

The technical problems to be addressed by the disclosure are not limited to those described above, and other technical problems, which are not described above, may be clearly understood by a person ordinarily skilled in the related art to which the disclosure belongs.

Technical Solution

In accordance with an aspect of the disclosure, an electronic device is provided. The electronic device includes a display panel and a camera module arranged under the display panel. The display panel may include a first area including a first plurality of pixels having a first pixel density and overlapping the camera module, a second area including a second plurality of pixels having a second pixel density greater than the first pixel density, a first light reflection blocking layer arranged in all or at least a portion of the first area, and a plurality of transparent wiring lines arranged under first organic light-emitting diodes arranged in the first area. The first light reflection blocking layer may be arranged to overlap lower portions of the first organic light-emitting diodes arranged in the first area. The first light reflection blocking layer may be arranged between anode electrodes of the first organic light-emitting diodes and the plurality of transparent wiring lines.

In accordance with another aspect of the disclosure, an electronic device is provided. The electronic device includes a display panel and a camera module arranged under the display panel. The display panel may include a first area including a first plurality of pixels having a first pixel density and overlapping the camera module, a second area including a second plurality of pixels having a second pixel density greater than the first pixel density, a first light reflection blocking layer arranged in all or at least a portion of the first area, a second light reflection blocking layer arranged in all or at least a portion of the second area, and a plurality of transparent wiring lines arranged under first organic light-emitting diodes arranged in the first area. The first light reflection blocking layer may be arranged to overlap lower portions of the first organic light-emitting diodes arranged in the first area. The first light reflection blocking layer may be arranged between anode electrodes of the first organic light-emitting diodes and the plurality of transparent wiring lines. The second light reflection blocking layer may be provided to extend to at least a portion of the first area.

Advantageous Effects

In the electronic device including a camera module according to various embodiments of the disclosure, by arranging the light reflection blocking layer under anode electrodes in the first area (e.g., an under-display camera area) of the display panel, it is possible to prevent the light incident on the display from being reflected. By preventing light incident on the inside of the display panel from being incident on the camera module, it is possible to prevent a light flare from occurring.

Other aspects, advantages, and salient features of the disclosure will become apparent to those skilled in the art from the following detailed description, which, taken in conjunction with the annexed drawings, discloses various embodiments of the disclosure.

DESCRIPTION OF DRAWINGS

The above and other aspects, features, and advantages of certain embodiments of the disclosure will be more apparent from the following description taken in conjunction with the accompanying drawings, in which:

FIG. 3A is a view illustrating an unfolded (e.g., opened) state of an electronic device according to an embodiment of the disclosure;

Throughout the drawings, like reference numerals will be understood to refer to like parts, components, and structures.

MODE FOR INVENTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
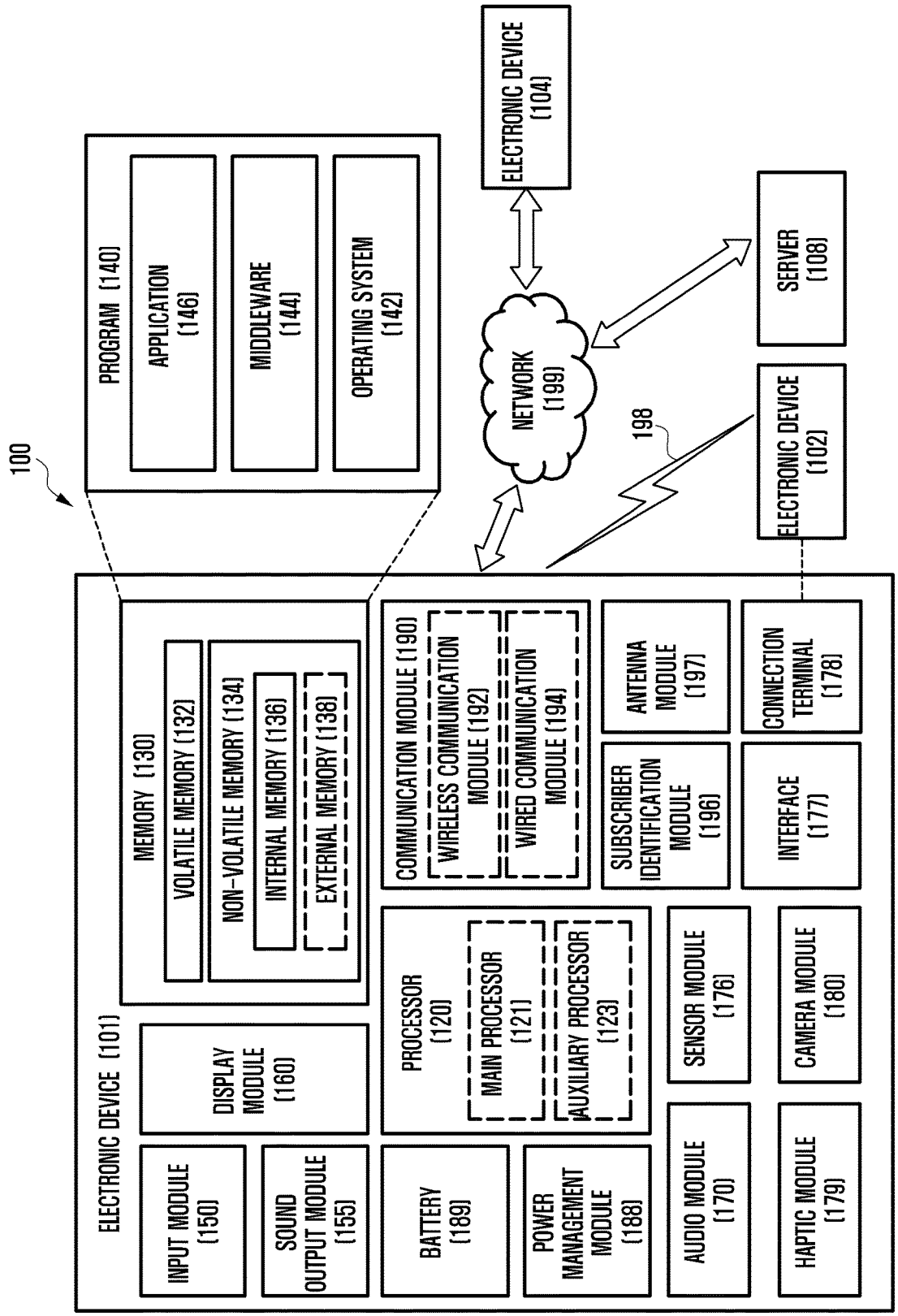
FIG. 1 is a block diagram illustrating an electronic device within a network environment according to an embodiment of the disclosure.

FIG. 1 is a block diagram illustrating an electronic device 101 in a network environment 100 according to an embodiment of the disclosure.

Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connection terminal 178, a haptic module 179, a camera module 180, a power management module 188, a battery 189, a communication module 190, a subscriber identification module (SIM) 196, or an antenna module 197. In some embodiments, at least one of the components (e.g., the connection terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connection terminal 178 may include a connector via which the electronic device 101 may be physically connected with the external electronic device (e.g., the electronic device 102). According to an embodiment, the connection terminal 178 may include, for example, a HDMI connector, a USB connector, an SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5th generation (5G) network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4th generation (4G) network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used in connection with various embodiments of the disclosure, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

According to an embodiment, a display module 160 illustrated in FIG. 1 may include a flexible display configured such that a screen (e.g., a display screen) is folded or unfolded.

According to an embodiment, the display module 160 illustrated in FIG. 1 may include a flexible display that is slidably arranged to provide a screen (e.g., a display screen).

According to an embodiment, although it has been described that the display module 160 illustrated in FIG. 1 includes a foldable display or a flexible display, the disclosure is not limited thereto. The display module 160 may include a bar type display or a plate type display.

Figure 2A:
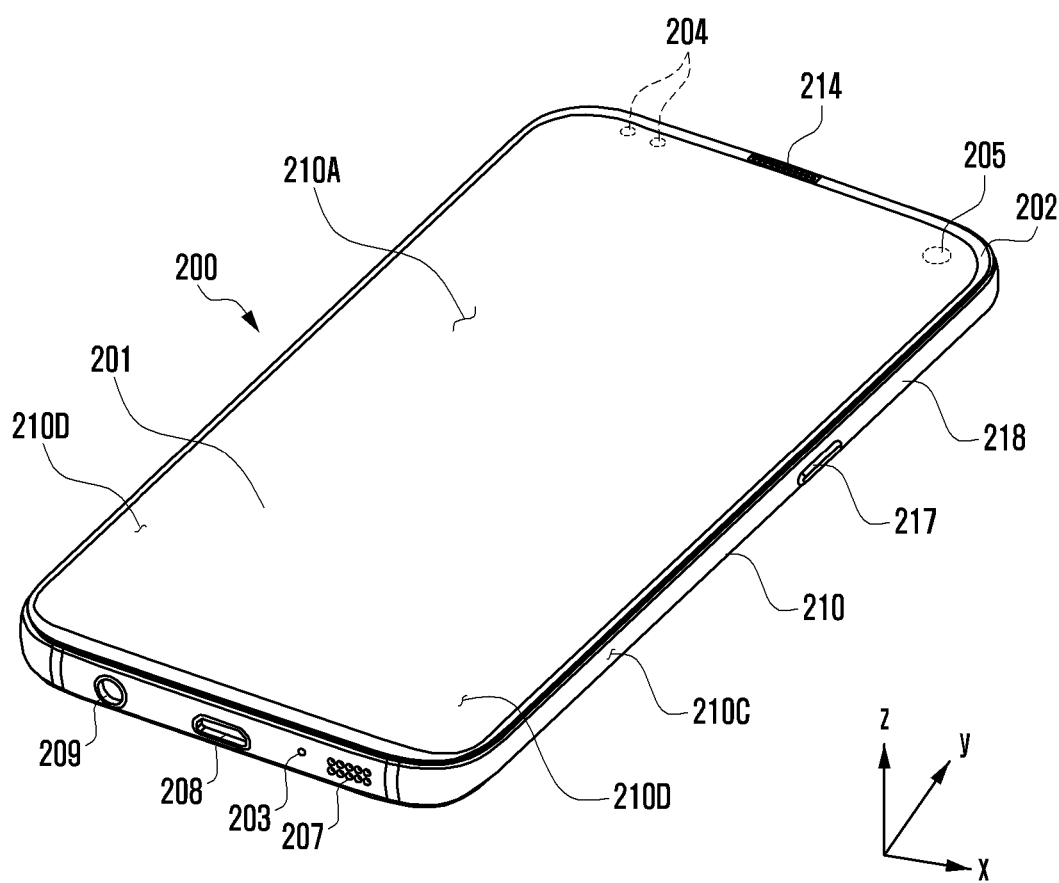
FIG. 2A is a front perspective view illustrating an electronic device according to an embodiment of the disclosure.

FIG. 2A is a front perspective view illustrating an electronic device according to an embodiment of the disclosure.

Figure 2B:
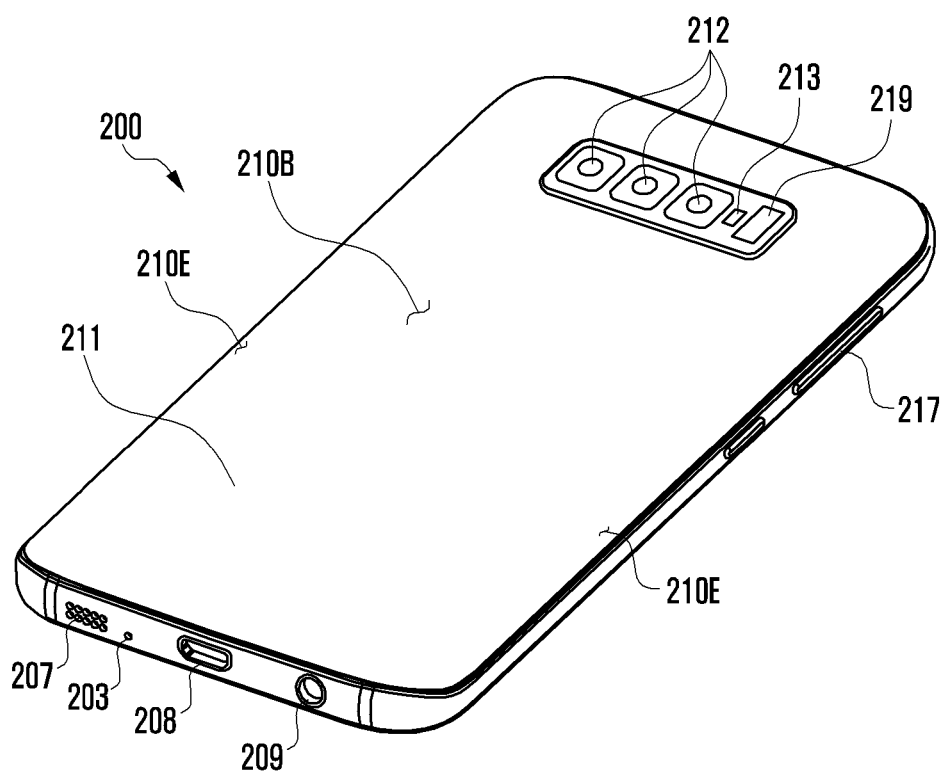
FIG. 2B is a rear perspective view illustrating the electronic device according to an embodiment of the disclosure.

FIG. 2B is a rear perspective view illustrating the electronic device according to an embodiment of the disclosure.

Referring to FIGS. 2A and 2B, an electronic device 200 (e.g., the electronic device 101 in FIG. 1) according to various embodiments of the disclosure may include a first surface (or a front surface) 210A and a second surface (or a rear surface) 210B, and a housing 210. A display 201 (e.g., the display module 160 in FIG. 1) may be arranged in a space defined by the housing 210. The housing 210 may include a side surface 210C surrounding a space between the first surface 210A and the second surface 210B. In another embodiment, the term "housing 210" may refer to a structure providing a part of the first surface 210A, the second surface 210B, and the side surface 210C.

According to an embodiment, at least a portion of the first surface 210A may be defined by a substantially transparent front plate 202 (e.g., a glass plate or a polymer plate including various coating layers).

According to an embodiment, the second surface 210B may be defined by a substantially opaque rear plate 211. The rear plate 211 may be made of, for example, coated or colored glass, ceramic, polymer, metal (e.g., aluminum, stainless steel (STS), or magnesium), or a combination of two or more of these materials. However, the disclosure is not limited thereto, and the rear plate 211 may be formed of transparent glass.

According to an embodiment, the side surface 210C may be defined by a side bezel structure (or a "side member") 218 coupled to the front plate 202 and the rear plate 211 and including metal and/or polymer. In some embodiments, the rear plate 211 and the side bezel structure 218 may be integrally configured, and may include the same material (e.g., a metal material such as aluminum).

As an embodiment, the front plate 202 may include two first areas 210D, which are bent from the first surface 210A toward the rear plate 211 and extend seamlessly. The two first areas 210D may be disposed at opposite long edge ends of the front plate 202.

As an embodiment, the rear plate 211 may include two second areas 210E, which are bent from the second surface 210B toward the front plate 202 and extend seamlessly.

In some embodiments, the front plate 202 (or the rear plate 211) may include only one of the first areas 210D (or the second areas 210E). In some embodiments, some of the first areas 210D or the second areas 210E may not be included. In the embodiments, when viewed from a side of the electronic device 200, the side bezel structure 218 may have a first thickness (or width) at the side at which the first areas 210D or the second areas 210E are not included, and may have a second thickness (or width), which is smaller than the first thickness at the side at which the first areas 210D or the second areas 210E are included.

According to an embodiment, the electronic device 200 may include at least one of a display 201 (e.g., the display module 160 in FIG. 1), a sound input device 203 (e.g., the input module 150 in FIG. 1), sound output devices 207 and 214 (e.g., the sound output module 155 in FIG. 1), sensor modules 204 and 219 (e.g., the sensor module 176 in FIG. 1), camera modules 205 and 212 (e.g., the camera module 180 in FIG. 1), a flash 213, a key input device 217, an indicator (not illustrated), and connector holes 208 and 209. In some embodiments, in the electronic device 200, at least one of the components (e.g., the key input device 217) may be omitted, or other components may be additionally included.

According to an embodiment, the display 201 (e.g., the display module 160 in FIG. 1) may be visually visible through an upper end portion of the front plate 202. In some embodiments, at least a portion of the display 201 may be visible through the front plate 202 defining the first surface 210A and the first areas 210D of the side surface 210C. The display 201 may be coupled to or arranged adjacent to a touch-sensitive circuit, a pressure sensor capable of measuring touch intensity (pressure), and/or a digitizer configured to detect a magnetic-field-type stylus pen. In some embodiments, at least some of the sensor modules 204 and 219 and/or at least some of the key input devices 217 may be arranged in the first areas 210D and/or the second areas 210E.

In some embodiments, at least one of a sensor module 204, a camera module 205 (e.g., an image sensor), an audio module 214, and a fingerprint sensor may be included on the rear surface of the screen display area of the display 201.

According to some embodiments, the display 201 may be coupled to or arranged adjacent to a touch-sensitive circuit, a pressure sensor capable of measuring the intensity of a touch (pressure), and/or a digitizer that detects a magnetic-field-type stylus pen.

In some embodiments, at least some of the sensor modules 204 and 219 and/or at least some of the key input devices 217 may be arranged in the first areas 210D and/or the second areas 210E.

According to an embodiment, the sound input device 203 may include a microphone. In some embodiments, the input device 203 may include a plurality of microphones arranged to sense the direction of sound. The sound output devices 207 and 214 may include speakers. The sound output devices 207 and 214 may include an external speaker 207 and a receiver for a call (e.g., the audio module 214). According to some embodiments, the sound input device 203 (e.g., a microphone), the sound output devices 207 and 214, and the connector holes 208 and 209 are arranged in the inner space in the electronic device 200, and may be exposed to the external environment through one or more holes provided in the housing 210. According to some embodiments, the holes provided in the housing 210 may be commonly used for the input device 203 (e.g., a microphone) and the sound output devices 207 and 214. According to some embodiments, the sound output devices 207 and 214 may include a speaker that operates without a separate speaker hole provided in the housing 210 (e.g., a piezo speaker).

According to an embodiment, the sensor modules 204 and 219 (e.g., the sensor module 176 in FIG. 1) may generate an electrical signal or a data value corresponding to the internal operating state or the external environmental state of the electronic device 200. The sensor modules 204 and 219 may include, for example, a first sensor module 204 (e.g., a proximity sensor) arranged on the first surface 210A of the housing 210, a second sensor module 219 (e.g., an HRM sensor) arranged on the second surface 210B of the housing 210, and/or a third sensor module (not illustrated) (e.g., a fingerprint sensor). For example, the fingerprint sensor may be arranged on the first surface 210A (e.g., the display 201) and/or the second surface 210B of the housing 210. The electronic device 200 may further include at least one of sensor modules (not illustrated), such as a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, or an illuminance sensor.

According to an embodiment, the camera modules 205 and 212 may include a first camera module 205 arranged on the first surface 210A of the electronic device 200, and a second camera module 212 arranged on the second surface 210B of the electronic device 200. A flash 213 may be disposed around the camera modules 205 and 212. The camera modules 205 and 212 may include one or more lenses, an image sensor, and/or an image signal processor. The flash 213 may include, for example, a light-emitting diode or a xenon lamp.

As an embodiment, the first camera module 205 may be arranged under the display panel of the display 201 in a manner of an under-display camera (UDC). In some embodiments, two or more lenses (a wide-angle lens and a telephoto lens) and image sensors may be arranged on one surface of the electronic device 200. In some embodiments, a plurality of first camera modules 205 may be arranged on the first surface of the electronic device 200 (e.g., the surface on which a screen is to be displayed) in an under-display camera (UDC) manner.

As an embodiment, the key input devices 217 may be arranged on the side surface 210C of the housing 210. In another embodiment, the electronic device 200 may not include some or all of the above-mentioned key input devices 217, and a key input device 217, which is not included in the electronic device 101, may be implemented in another form, such as a soft key, on the display 201. In some embodiments, a key input device 217 may be implemented using a pressure sensor included in the display 201.

As an embodiment, the connector holes 208 and 209 may include a first connector hole 208, which is capable of accommodating a connector (e.g., a USB connector) for transmitting/receiving power and/or data to/from an external electronic device, and/or a second connector hole 209 (or an earphone jack), which is capable of accommodating a connector for transmitting/receiving an audio signal to/from an external electronic device. The first connector hole 208 may include a universal serial bus (USB) A type or a USB C type port. When the first connector hole 208 supports the USB C type, the electronic device 200 (e.g., the electronic device 101 in FIG. 1) may support USB power delivery (PD) charging.

As an embodiment, some camera modules 205 of the camera modules 205 and 212 and/or some sensor modules 204 of the sensor modules 204 and 219 may be arranged to be visually visible through the display 201. As another example, when the camera module 205 is arranged in a UDC manner, the camera module 205 may not be visually visible to the outside.

As an embodiment, the camera module 205 may be arranged to overlap the display area, and a screen may also be displayed on the display area corresponding to the camera module 205. Some sensor modules 204 may be disposed in the internal space in the electronic device so as to perform the functions thereof without being visually exposed through the front plate 202.

FIG. 3A is a view illustrating an unfolded (e.g., opened) state of an electronic device according to an embodiment of the disclosure.

Figure 3B:
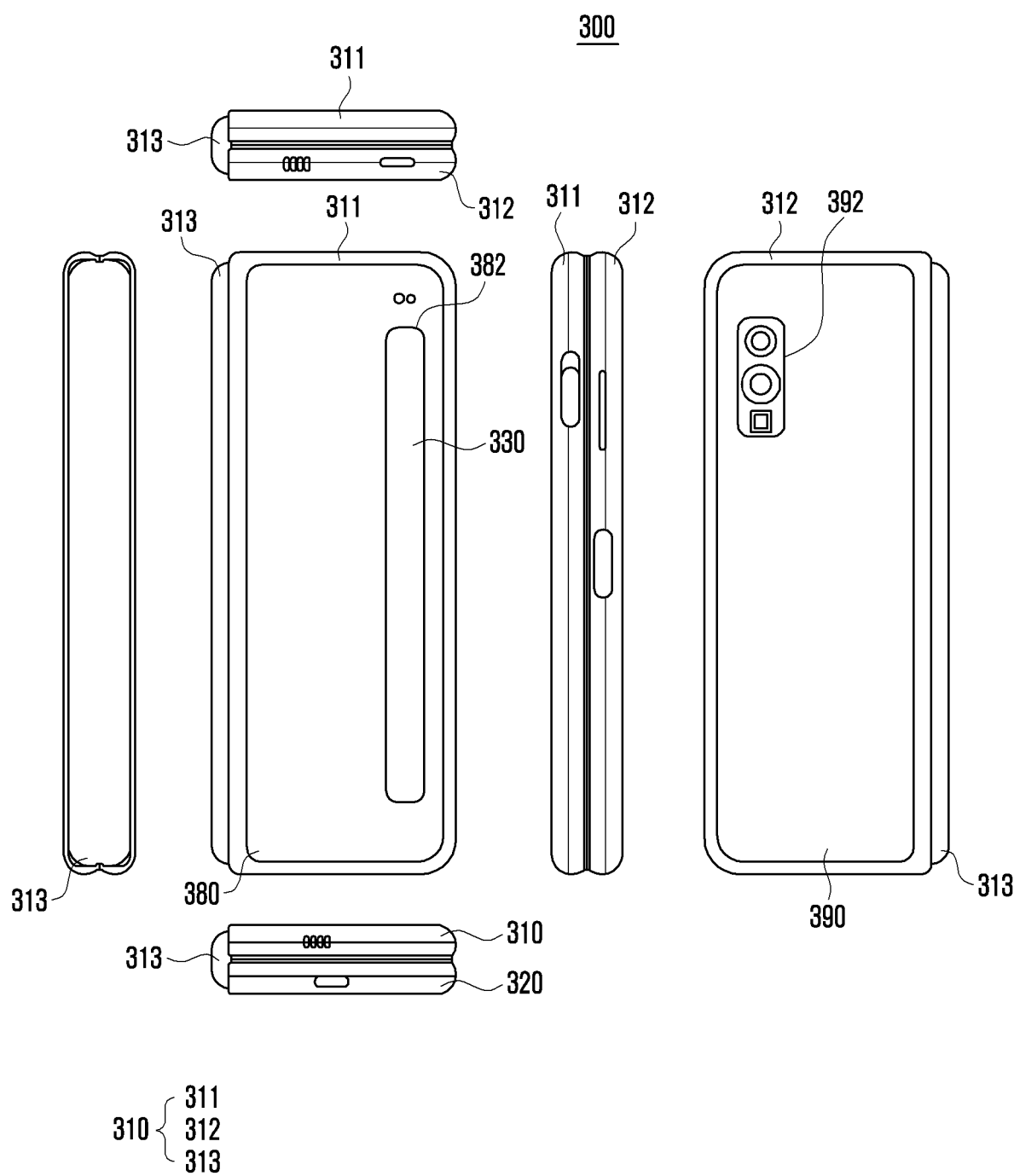
FIG. 3B is a view illustrating a folded (e.g., closed) state of the electronic device according to an embodiment of the disclosure.

FIG. 3B is a view illustrating a folded (e.g., closed) state of the electronic device according to an embodiment of the disclosure.

Referring to FIGS. 3A and 3B, an electronic device 300 (e.g., the electronic device 101 in FIG. 1) may include a housing 310 and a display 320 arranged in a space defined by the housing 310. As an embodiment, the display 320 may include a flexible display or a foldable display.

The surface on which the display 320 is arranged may be defined as a first surface or a front surface of the electronic device 300 (e.g., a surface on which a screen is to be displayed when unfolded). In addition, the surface opposite the front surface may be defined as a second surface or a rear surface of the electronic device 300. In addition, the surface surrounding the space between the front surface and the rear surface may be defined as a third surface or a side surface of the electronic device 300. For example, in the electronic device 300, the folding area 323 may be folded or unfolded in a first direction (e.g., the x-axis direction) with reference to a folding axis (e.g., an axis A).

As an embodiment, the housing 310 may include a first housing structure 311, a second housing structure 312 including a sensor area 324, a first rear cover 380, and a second rear cover 390. The housing 310 of the electronic device 101 is not limited to the shape and assembly illustrated in FIGS. 3A and 3B, and may be implemented by a combination and/or an assembly of different shapes or components. For example, in another embodiment, the first housing structure 311 and the first rear cover 380 may be integrated with each other, and the second housing structure 312 and the second rear cover 390 may be integrated with each other.

As an embodiment, the first housing structure 311 and the second housing structure 312 may be arranged on opposite sides about the folding axis A, and may have generally symmetrical shapes with respect to the folding axis A. The angle or distance formed between the first housing structure 311 and the second housing structure 312 may vary depending on whether the electronic device 300 is in an unfolded state (e.g., a first state), a folded state (e.g., a second state), or an intermediate state (e.g., a third state).

As an embodiment, unlike the first housing structure 311, the second housing structure 312 may additionally include the sensor area 324 in which various sensors (e.g., an illuminance sensor, an iris sensor, and/or an image sensor) are arranged, but the first and second structures may have mutually symmetrical shapes in other areas.

As an embodiment, at least one sensor (e.g., a camera module, an illuminance sensor, an iris sensor, and/or an image sensor) may be arranged not only in the sensor area 324, but also below the display and/or in bezel area.

As an embodiment, the first housing structure 311 and the second housing structure 312 may define together a recess that accommodates the display 320. In the illustrated embodiment, due to the sensor area 324, the recess may have two or more different widths in a direction (e.g., in an x-axis direction) perpendicular to the folding axis A.

For example, the recess may have a first width W1 between a first portion 311a of the first housing structure 311 and a first portion 312a of the second housing structure 312 that is provided at an edge of the sensor area 324 of the second housing structure 312. The recess may have a second width W2 formed by a second portion 311b of the first housing structure 311 that is parallel to the folding axis A in the first housing structure 311 and a second portion 312b of the second housing structure 312 that does not correspond to the sensor area 324 in the second housing structure 312 and is parallel to the folding axis A. In this case, the second width W2 may be greater than the first width W1. In other words, the first portion 311a of the first housing structure 311 and the first portion 312a of the second housing structure 312, which have mutually asymmetric shapes, may form the first width W1 of the recess. The second portion 311b of the first housing structure 311 and the second portion 312b of the second housing structure 312, which have mutually symmetrical shapes, may form the second width W2 of the recess.

As an embodiment, the distance from the folding axis A to the first portion 312a of the second housing structure 312 and the distance from the folding axis A the second portion 312b of the second housing structure 312 may be different from each other. The widths of the recess are not limited to the illustrated example. In various embodiments, the recess may have multiple widths due to the shape of the sensor area 324 or due to the asymmetric portions of the first housing structure 311 and the second housing structure 312.

As an embodiment, at least a portion of the first housing structure 311 and at least a portion of the second housing structure 312 may be formed of a metal material or a non-metal material having rigidity of a level selected in order to support the display 320.

As an embodiment, the sensor area 324 may have a predetermined area adjacent to one corner of the second housing structure 312. However, the arrangement, shape, and size of the sensor area 324 are not limited to those in the illustrated example. For example, in another embodiment, the sensor area 324 may be provided at another corner of the second housing structure 312 or in any area between the upper and lower end corners.

As an embodiment, components embedded in the electronic device 300 to perform various functions may be exposed to the front surface of the electronic device 300 through the sensor area 324 or one or more openings provided in the sensor area 324. In various embodiments, the components may include various types of sensors. The sensor may include, for example, at least one of an illuminance sensor, a front camera (e.g., a camera module), a receiver, or a proximity sensor.

The first rear cover 380 may be arranged at one side of the folding axis A on the rear surface of the electronic device, and may have, for example, a substantially rectangular periphery, which may be enclosed by the first housing structure 311. Similarly, the second rear cover 390 may be arranged on the other side of the folding axis A in the rear surface of the electronic device, and the periphery of the second rear cover 390 may be enclosed by the second housing structure 312.

In the illustrated embodiment, the first rear cover 380 and the second rear cover 390 may have substantially symmetrical shapes about the folding axis A. However, the first rear cover 380 and the second rear cover 390 do not necessarily have mutually symmetrical shapes. In another embodiment, in the electronic device 300, the first rear cover 380 and the second rear cover 390 may have various shapes. In another embodiment, the first rear cover 380 may be integrated with the first housing structure 311, and the second rear cover 390 may be integrated with the second housing structure 312.

As an embodiment, the first rear cover 380, the second rear cover 390, the first housing structure 311, and the second housing structure 312 may define a space in which various components (e.g., a printed circuit board or a battery) of the electronic device 300 may be arranged. As an embodiment, one or more components may be arranged or visually exposed on the rear surface of the electronic device 300. For example, at least a portion of a sub-display 330 may be visually exposed through a first rear area 382 of the first rear cover 380. In another embodiment, one or more components or sensors may be visually exposed through a second rear area 392 of the second rear cover 390. In various embodiments, the sensors may include an illuminance sensor, a proximity sensor, and/or a rear camera.

As an embodiment, the hinge cover 313 may be arranged between the first housing structure 311 and the second housing structure 312 and configured to cover an internal component (e.g., the hinge structure). The hinge cover 313 may cover a portion in which the first housing structure 311 and the second housing structure 312 are brought into contact each other by unfolding and folding the electronic device 300.

As an embodiment, the hinge cover 313 may be covered by a portion of the first housing structure 311 and a portion of the second housing structure 312 or exposed to the outside depending on whether the electronic device 101 is in the unfolded state (flat state) or in the folded state. As an embodiment, when the electronic device 101 is in the unfolded state, the hinge cover 313 may not be exposed by being covered by the first housing structure 311 and the second housing structure 312. As an embodiment, when the electronic device 101 is in the folded state (e.g., the fully folded state), the hinge cover 313 may be exposed to the outside between the first housing structure 311 and the second housing structure 312. As an embodiment, when the first housing structure 311 and the second housing structure 312 are in the intermediate state in which the first housing structure 311 and the second housing structure 312 are folded with a certain angle therebetween, the hinge cover 313 may be exposed to the outside between the first housing structure 311 and the second housing structure 312. In this case, however, the exposed area may be smaller than that in the fully folded state. As an embodiment, the hinge cover 313 may include a curved surface.

The display 320 may be arranged in a space defined by the housing 310. For example, the display 320 may be seated in the recess defined by the housing 310, and may constitute most of the front surface of the electronic device 300.

Accordingly, the front surface of the electronic device 300 may include the display 320, and a partial area of the first housing structure 311 and a partial area of the second housing structure 312, which are adjacent to the display 320. In addition, the rear surface of the electronic device 300 may include the first rear cover 380, a partial area of the first housing structure 311 adjacent to the first rear cover 380, the second rear cover 390, and a partial area of the second housing structure 312 adjacent to the second rear cover 390.

The display 320 may be a display in which at least a partial area is deformable into a planar surface or a curved surface. As an embodiment, the display 320 may include a folding area 323, a first area 321 arranged on one side (e.g., the left side in FIG. 3A), and a second area 322 arranged on the other side (the right side in FIG. 3A) with reference to the folding area 323.

As an embodiment, the display 320 may include a top emission or bottom emission type organic light-emitting diode (OLED) display. The OLED display may include a low-temperature color filter (LTCF) layer, window glass (e.g., an ultra-thin glass (UTG) or polymer window) and an optical compensation film (OCF). A polarizing film (or a polarizing layer) may be replaced with the LTCF layer of the OLED display.

In an embodiment, the area division of the display 320 is illustrative, and the display 320 may be divided into multiple areas (e.g., two or more areas) depending on the structure or functions thereof. As an embodiment, the area of the display 320 may be divided by the folding area 323 or the folding axis A extending parallel to the y axis. However, in another embodiment, the area of the display 320 may be divided with reference to another folding area (e.g., a folding area parallel to the x axis) or another folding axis (e.g., a folding axis parallel to the x axis).

As an embodiment, the first area 321 and the second area 322 may have generally symmetrical shapes about the folding area 323.

Hereinafter, the operation of the first housing structure 311 and the second housing structure 312 and respective areas of the display 320 according to the states of the electronic device 300 (e.g., the unfolded state (flat state) and the folded state) will be described.

As an embodiment, when the electronic device 300 is in the unfolded state (flat state) (e.g., FIG. 3A), the first housing structure 311 and the second housing structure 312 may be arranged to form an angle of 180 degrees therebetween and to be oriented in the same direction. The surface of the first area 321 and the surface of the second area 322 of the display 320 form 180 degrees relative to each other, and may be oriented in the same direction (e.g., the front direction of the electronic device). The folding area 323 may form the same plane as the first area 321 and the second area 322.

As an embodiment, when the electronic device 300 is in the folded state (e.g., FIG. 3B), the first housing structure 311 and the second housing structure 312 may be arranged to face each other. The surface of the first area 321 and the surface of the second area 322 of the display 320 may face each other while forming a narrow angle (e.g., an angle between 0 and 10 degrees) relative to each other. At least a portion of the folding area 323 may be configured as a curved surface having a predetermined curvature.

As an embodiment, when the electronic device 300 is in the intermediate state (a half-folded state), the first housing structure 311 and the second housing structure 312 may be arranged to form a certain angle relative to each other. The surface of the first area 321 and the surface of the second area 322 of the display 320 may form an angle greater than that in the folded state and smaller than that in the unfolded state. At least a portion of the folding area 323 may have a curved surface having a predetermined curvature, and the curvature at this time may be smaller than that in the folded state.

An electronic device according to various embodiments of the disclosure may include electronic devices such as a bar type, a foldable type, a rollable type, a sliding type, or a wearable type electronic device, a tablet personal computer (PC), and/or a notebook PC. The electronic device 200 according to various embodiments of the disclosure is not limited to the above-described examples, and may include various other electronic devices.

Figure 4:
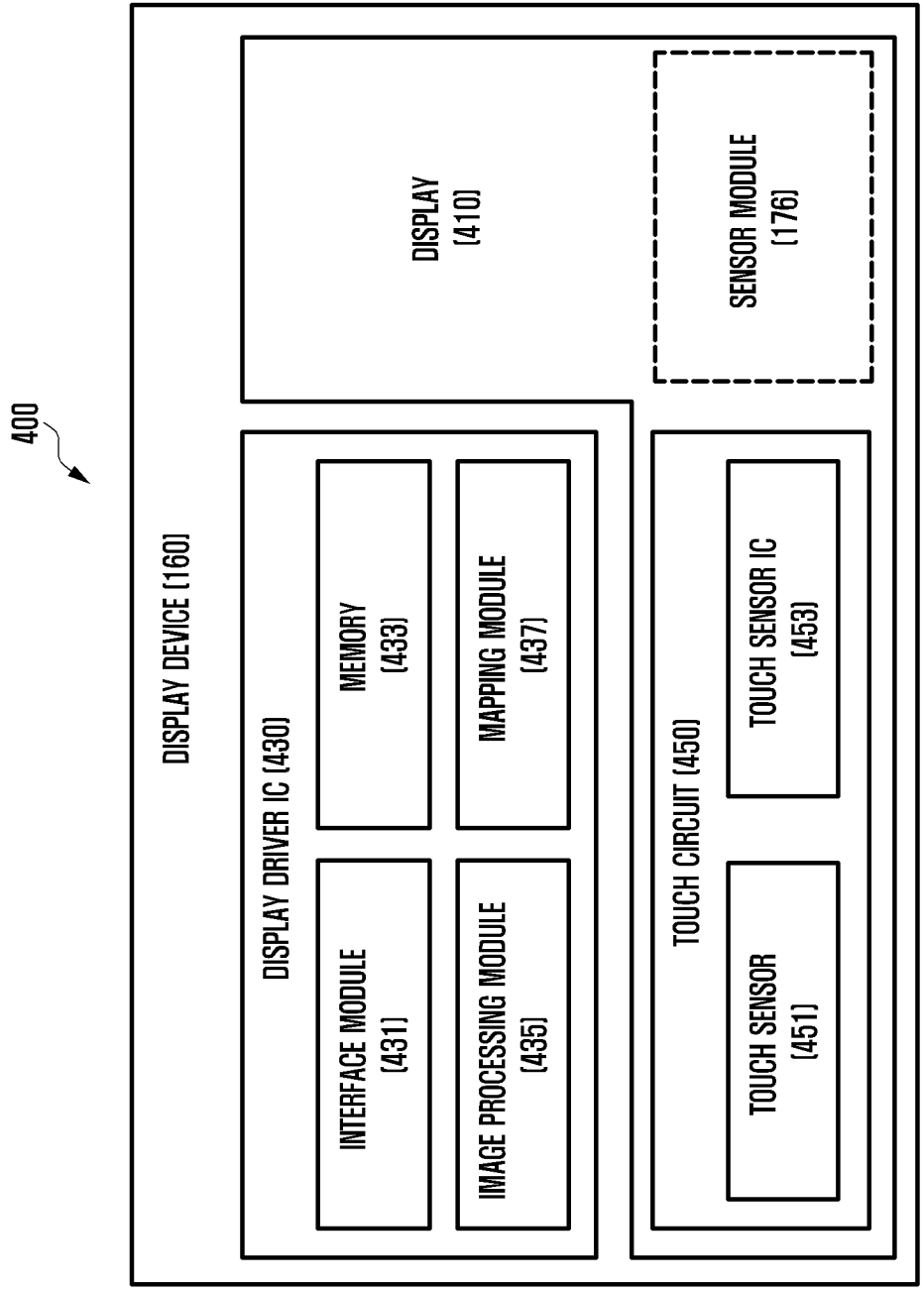
FIG. 4 is a block diagram of a display module of an electronic device according to an embodiment of the disclosure.

FIG. 4 is a block diagram of a display module 160 of an electronic device 400 according to an embodiment of the disclosure.

Referring to FIG. 4, the display module 160 may include a display 410 (e.g., the display 201 in FIG. 2A or the display 320 in FIG. 3A), and a display driver display IC 430 (hereinafter, referred to as "DDI 430") configured to control the display 410.

The DDI 430 may include an interface module 431, a memory 433 (e.g., a buffer memory), an image processing module 435, and/or a mapping module 437.

According to an embodiment, the DDI 430 may receive image data or image information including an image control signal corresponding to a command for controlling the image data from another component of the electronic device 400 (e.g., the electronic device 101 in FIG. 1, the electronic device 200 in FIG. 2A, or the electronic device 300 in FIG. 3A) via the interface module 431.

According to an embodiment, the image information may be received from a processor (e.g., the processor 120 in FIG. 1) (e.g., the main processor 121 in FIG. 1)) (e.g., an application processor), or an auxiliary processor 123 (e.g., the auxiliary processor 123 in FIG. 1) (e.g., a graphics processing device) operated independently from the function of the main processor 121.

According to an embodiment, the DDI 430 may communicate with a touch circuit 450 or a sensor module 176 (e.g., the camera module 205 in FIG. 2A or and a camera module arranged in the sensor area 324 in FIG. 3A) via the interface module 431. In addition, the DDI 430 may store at least a part of the received image information in the memory 433. As an example, the DDI 430 may store at least a part of the received image information in the memory 433 in units of frames.

According to an embodiment, the image processing module 435 may perform pre-processing or post-processing (e.g., adjustment of resolution, brightness, or size) on at least a part of the image data based at least on characteristics of the video data or the characteristics of the display 410.

According to an embodiment, the mapping module 437 may generate a voltage value or a current value corresponding to the image data pre-processed or post-processed via the image processing module 435. As an embodiment, the generation of the voltage value or the current value may be performed based at least on, for example, the attributes of the pixels of the display 410 (e.g., the array of pixels (an RGB stripe or PenTile structure), the size of each of sub-pixels, or deterioration of pixels).

As an example, at least some of the pixels of the display 410 are driven based at least partially on the voltage value or the current value, so that visual information (e.g., text, images, or icons) corresponding to the video data can be displayed through the display 410.

According to an embodiment, the display module 160 may further include a touch circuit 450. The touch circuit 450 may include a touch sensor 451 and a touch sensor IC 453 configured to control the touch sensor 251.

As an embodiment, the touch sensor IC 453 may control the touch sensor 451 to detect a touch input or a hovering input with respect to a specific position in the display 410. For example, the touch sensor IC 453 may detect a touch input or a hovering input by measuring a change in a signal (e.g., voltage, light amount, resistance, or charge amount) with respect to a specific position in the display 410. The touch sensor IC 453 may provide a processor (e.g., the processor 120 in FIG. 1) with information about the detected touch input or hovering input (e.g., position, area, pressure, or time).

According to an embodiment, at least a part of the touch circuit 450 (e.g., the touch sensor IC 453) may be included as a part of the DDI 430 or the display 410.

According to an embodiment, at least a part of the touch circuit 450 (e.g., the touch sensor IC 453) may be included as a part of another component (e.g., the auxiliary processor 123) disposed outside the display module 160.

According to an embodiment, the display module 160 may further include a sensor module 176 and/or a control circuit for the sensor module 176. The sensor module 176 may include at least one sensor (e.g., a camera module, an illumination sensor, a fingerprint sensor, an iris sensor, a pressure sensor, and/or an image sensor). In this case, the at least one sensor or a control circuitry for the same may be embedded in a part of the display module 160 (e.g., the display 410 or the DDI 430) or a part of touch circuit 450.

According to an embodiment, when the sensor module 176 includes a camera module (e.g., an image sensor), the camera module (e.g., the image sensor) may be arranged below (e.g., under) the display in an under-display camera (UDC) manner.

According to an embodiment, when the sensor module 176 embedded in the display module 160 includes an illuminance sensor, the illuminance sensor may detect an exposure amount of ultraviolet (UV) according to exposure of the display to external light.

According to an embodiment, when the sensor module 176 embedded in the display module 160 includes a biometric sensor (e.g., a fingerprint sensor), the biometric sensor may acquire biometric information (e.g., a fingerprint image) associated with a touch input via a partial area of the display 320.

According to an embodiment, when the sensor module 176 embedded in the display module 160 includes a pressure sensor, the pressure sensor may acquire pressure information associated with a touch input via all or a part of the area of the display 320.

According to an embodiment, the touch sensor 451 or the sensor module 176 may be arranged between pixels of the pixel layer of the display 320, or above or below the pixel layer.

As another example, the sensor module 176 may be arranged in a bezel area of the electronic device (e.g., the electronic device 101 in FIG. 1).

Figure 5:
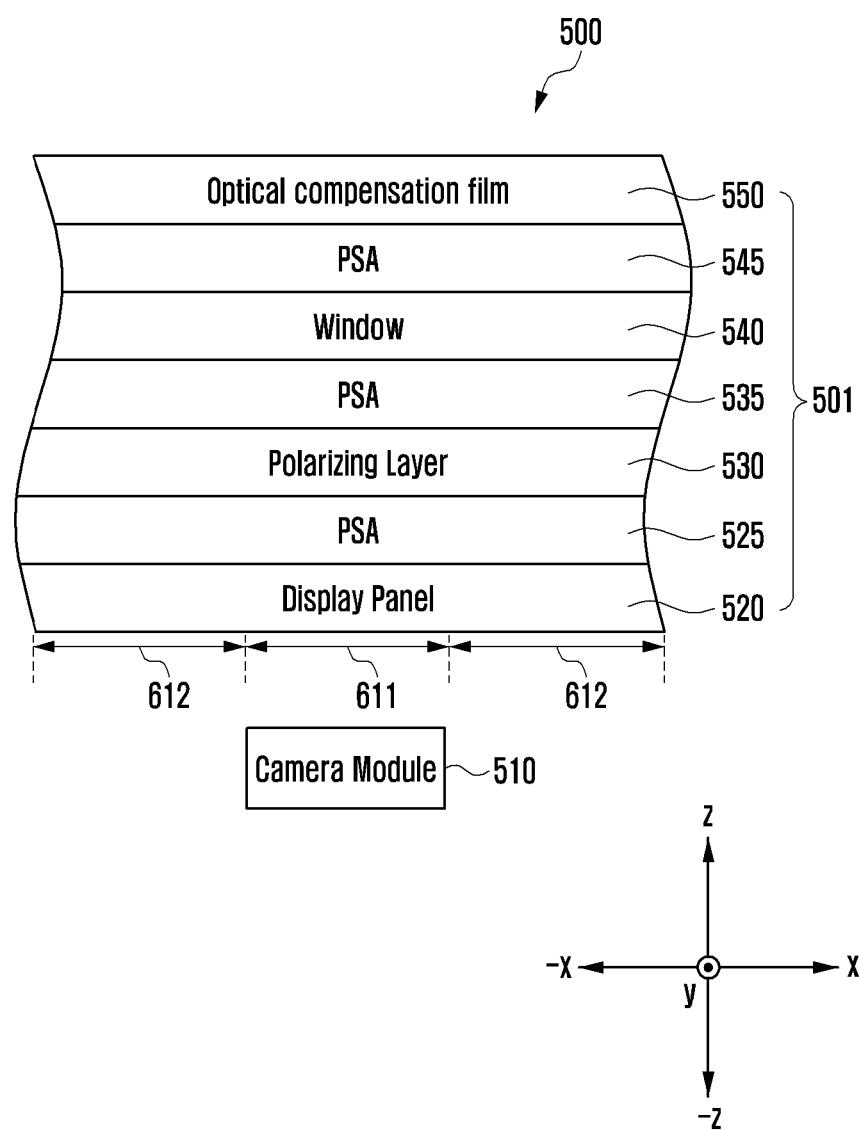
FIG. 5 is a view illustrating a display and a camera module (e.g., an image sensor) according to an embodiment of the disclosure.

FIG. 5 is a view illustrating a display and a camera module (e.g., an image sensor) according to an embodiment of the disclosure.

Figure 6:
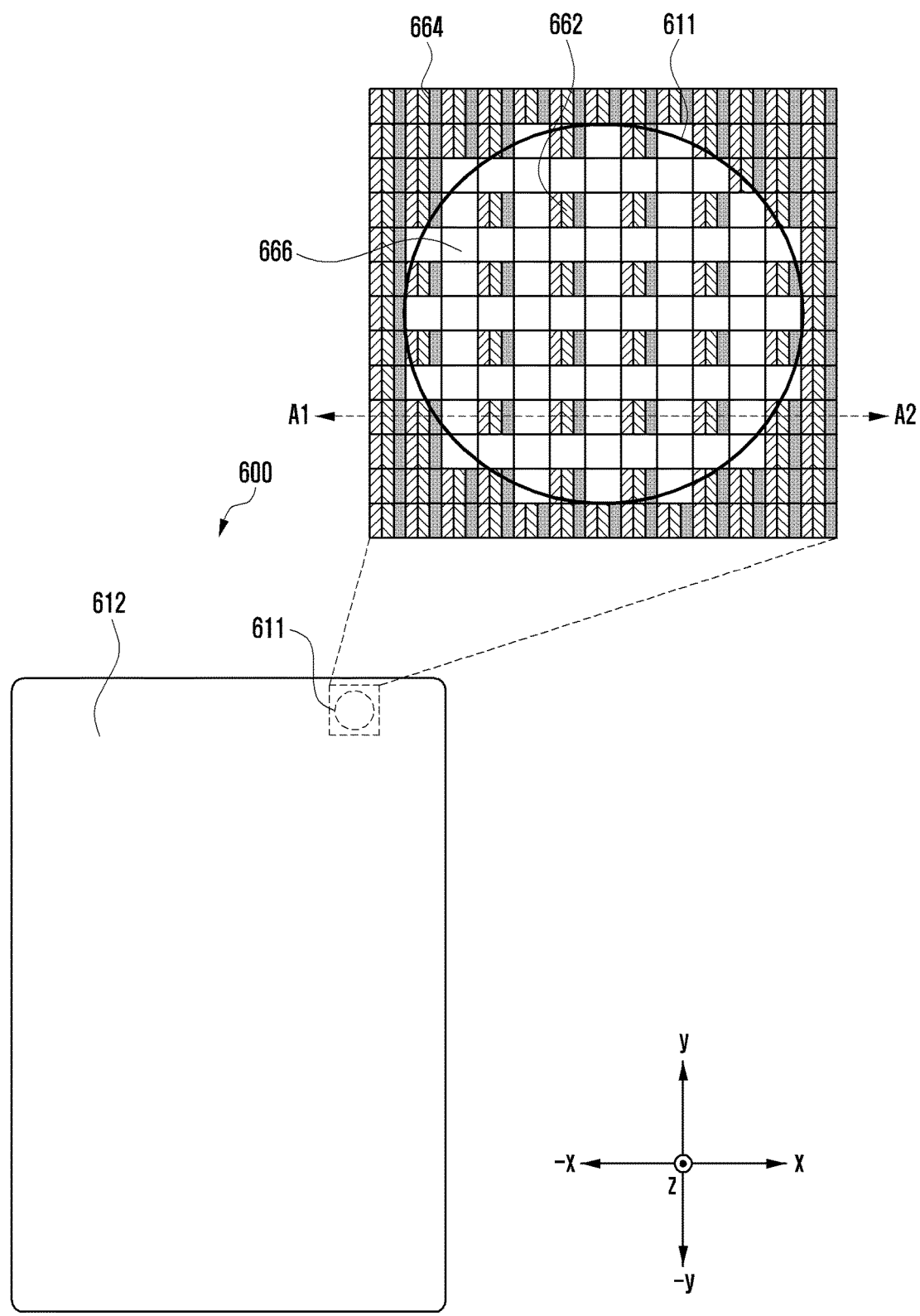
FIG. 6 is a view illustrating shapes of pixels arranged in a first area (e.g., an under-display camera area) and a second area (e.g., an active area) of a display according to an embodiment of the disclosure.

FIG. 6 is a view illustrating shapes of pixels arranged in a first area (e.g., an under-display camera area) and a second area (e.g., an active area) of a display according to an embodiment of the disclosure.

Figure 7:
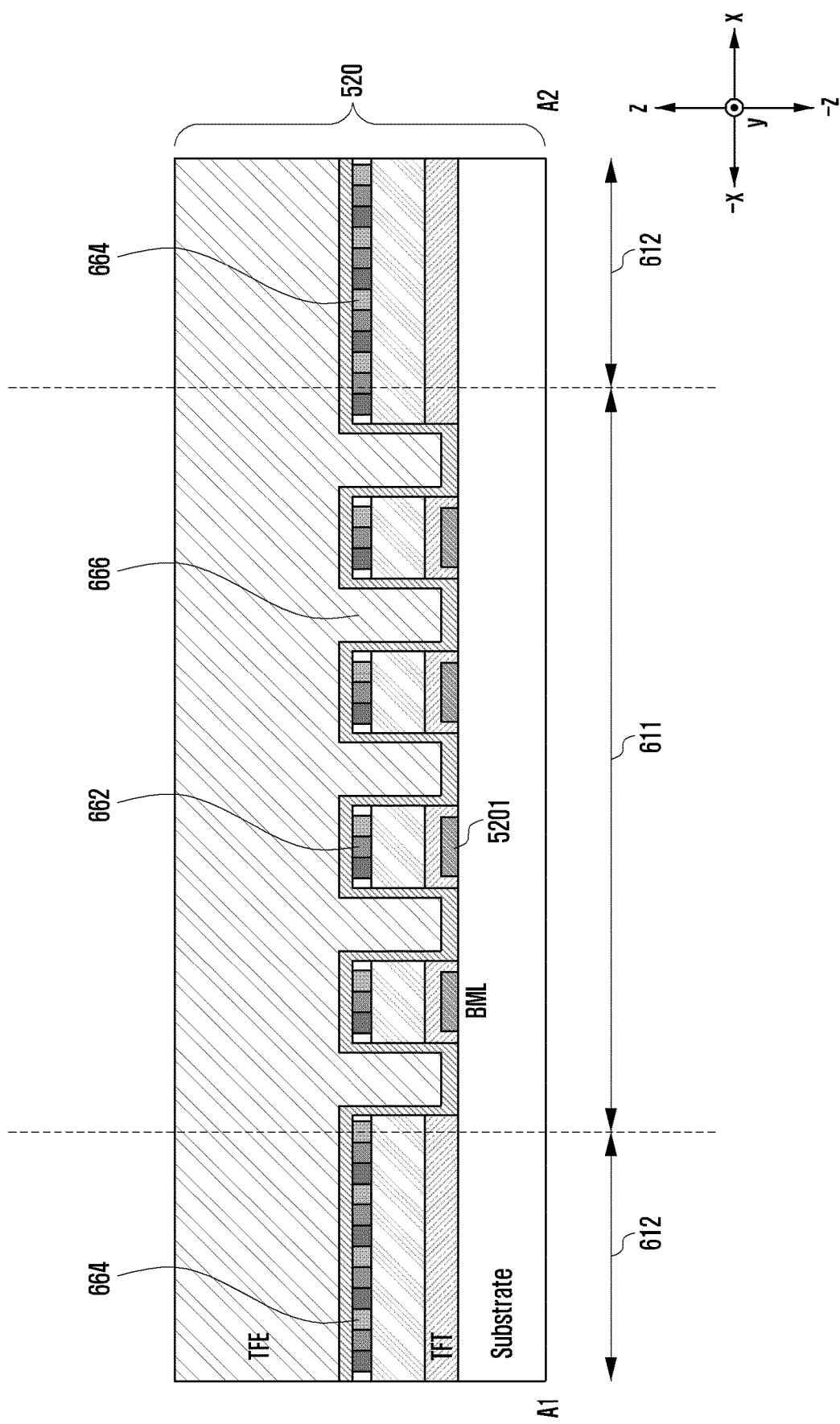
FIG. 7 is a view illustrating a cross section of a first area (e.g., an under-display camera area) and a second area (e.g., an active area) of a display according to an embodiment of the disclosure.

FIG. 7 is a view illustrating a cross section of a first area (e.g., an under-display camera area) and a second area (e.g., an active area) of a display according to an embodiment of the disclosure.

FIG. 7 illustrates a cross section taken along line A1-A2 in FIG. 6.

Referring to FIGS. 5 to 7, the electronic device 500 according to various embodiments of the disclosure may include a display 501 and a camera module 510 (e.g., the camera module 205 in FIG. 2A or the camera module arranged in the sensor area 324 in FIG. 3A).

According to an embodiment, the display 501 may include a display panel 520, a polarizing layer 530, a window 540 (e.g., an ultra-thin glass (UTG) or polymer window), and an optical compensation film (OCF) 550. The optical compensation film 550 may be arranged to correspond to the entire surface of the polarizing layer 530 and the window 540.

As an embodiment, as the window 540, an ultra-thin glass (UTG) or a polymer window may be applied.

According to an embodiment, the camera module 510 (or an image sensor) may be arranged below (e.g., under) the display 501 in an under-display camera (UDC) manner. For example, the camera module 510 may be arranged below (e.g., under) the display panel 520 in an under-display camera (UDC) manner.

As an embodiment, at least one camera module 510 may be disposed below the display panel 520.

As an embodiment, the display panel 520 may include a first area 611 (e.g., an under-display camera area) corresponding to the camera module 510 and a second area 612 (e.g., an active area).

As an embodiment, since first pixels 662 are arranged not only in the second area 612 (e.g., the active area) of the display panel 520, but also in a portion of the first area 611 (e.g., the under-display camera area) of the display panel 520 so that an image can be displayed. For example, the density of the first pixels 662 arranged in the first area 611 may be lower than that of second pixels 664 arranged in the second area 612.

FIG. 6 illustrates an example in which the first area 611 (e.g., an under-display camera area) is arranged at the top-right of the electronic device 600. However, the disclosure is not limited thereto, and the first area 611 (e.g., the under-display camera area) may be arranged at any location such as the top-center, top-left, center, center-right, center-left, bottom-center, or bottom-left of the electronic device 500 without restriction on the arrangement location.

As an embodiment, the polarizing layer 530 may be arranged above (e.g., in the z-axis direction) the display panel 520. The polarizing layer 530 may polarize incident light and output polarized light. The polarizing layer 530 may polarize light incident on the display panel 520 to prevent deterioration of display quality due to light reflection.

As another embodiment, the display 501 may be configured without the polarizing layer 530.

As an embodiment, the window 540 may be arranged on (e.g., in the z-axis direction) the display panel 520 or the polarizing layer 530. The optical compensation film 550 may be arranged on the window 540. The optical compensation film 550 may have a function of a protective film for protecting the window 540 and a function of a retardation film for preventing a rainbow color stain according to application of the polarizing layer 530.

It is illustrated that one optical compensation film 550 is arranged on the window 540, as an example. The disclosure is not limited thereto, and a plurality of optical compensation films may be arranged on the window 540. In addition, one optical compensation film 550 may be arranged on the window 540, and a protective layer (or a coating layer) may be arranged on the optical compensation film 550.

The optical compensation film 550 may have a protective film or shock absorption function in addition to the optical compensation function. Therefore, from the viewpoint of the protective film or shock absorption function, a thicker optical compensation film 550 may be preferable. However, in the case of a foldable phone, it is necessary to consider the thickness of the optical compensation film 550 because the folding characteristic is important. In this proposal, the optical compensation film 550 may have a thickness of, for example, 20 to 100 µm.

A first adhesive member 525 may be provided between the display panel 520 and the polarizing layer 530 so that the display panel 520 and the polarizing layer 530 can be bonded to each other. A second adhesive member 535 may be provided between the polarizing layer 530 and the window 540 so that the polarizing layer 530 and the window 540 can be bonded to each other. A third adhesive member 545 may be provided between the window 540 and the optical compensation film 550 so that the window 540 and the optical compensation film 550 can be bonded to each other.

The first to third adhesive members 525, 535, and 545 may include an optical clear adhesive (OCA), a pressure-sensitive adhesive (PSA), a heat-reactive adhesive, a general adhesive, or a double-sided tape. In order to facilitate attachment/detachment of the optical compensation film 650 arranged on the window 540, the adhesive force of the third adhesive member 545 may be lower (or weaker) than those of the first adhesive member 525 and the second adhesive member 535.

According to an embodiment, the display panel 520 and the polarizing layer 530 may be integrated with each other. According to an embodiment, when a color filter formed of red (R), green (G), and blue (B) pigments having a polarizing function is arranged on each of the pixels of the display panel 520, the polarizing layer 530 may be omitted. Even when the color filter having a polarizing function is applied, the optical compensation film 550 may be arranged on the window 540. For example, when a color filter having a polarizing function is applied without a polarizing plate or polarizing film (pol-less), a light reflection blocking layer (e.g., a black pixel define layer (BPDL)) capable of preventing reflection of external light may be included inside the display panel 520. As an example, a polarizing film (or a polarizing plate) serves to prevent reflection of external light, improve viewing angle characteristics, and improve black visibility. Thus, when a color filter having a polarizing function is applied, a light reflection blocking layer (e.g., a BPDL) may be applied together with the color filter in order to increase the color purity of the display panel 520. According to an embodiment, the polarizing layer 530 arranged above the display panel 520 may include openings perforated at positions corresponding to the camera module 510 (e.g., a lens) in order to prevent deterioration of the performance of the camera module 510 due to a refractive index. As an embodiment, at a position corresponding to the camera module 510, the polarizing layer 530 may be processed to be transparent or the polarizing characteristic may be removed from the polarizing layer 530. As an embodiment, the layers (e.g., the display panel 520) or the touch panel that do not have openings may include a coating capable of index matching in order to minimize a difference in refractive index.

The display panel 520 may be an organic light-emitting diode (OLED) panel, a liquid crystal display (LCD), or a quantum dot light-emitting diode (QLED) panel. The display panel 520 may include a plurality of pixels for displaying an image, and one pixel may include a plurality of sub-pixels. As an embodiment, one pixel may include sub-pixels of three colors (e.g., red, green, and blue). As an embodiment, one pixel may include sub-pixels of four colors (e.g., red, green, blue, and white). As an embodiment, one pixel may include one red sub-pixel, two green sub-pixels, and one blue sub-pixel by being configured in an RGBG PenTile manner.

According to various embodiments, the display 501 may include a control circuit (not illustrated). According to an embodiment, the control circuit may include a flexible printed circuit board (FPCB) electrically interconnecting a main printed circuit board and the display panel 520, and a display driver IC (DDI) (e.g., the display driver IC 430 in FIG. 4) mounted on the FPCB. As an embodiment, at least one side of the display panel 520 may extend, and the DDI 430 may be arranged on the extended portion in a chip on plastic (COP) manner.

According to an embodiment, the display 501 may additionally include a touch panel (e.g., the touch circuit 450 in FIG. 4). According to an embodiment, the display 501 may operate as an in-cell type or on-cell type touch display depending on a position at which the touch panel is arranged. When operating as an in-cell type, on-cell type, or add-on type touch display, the control circuit may include a touch display driver IC (TDDI). As an embodiment, the display 501 may include a sensor module (e.g., the sensor module 176 in FIG. 4).

As an embodiment, in the entire area of the display panel 520, a portion excluding the first area 611 (e.g., the under-display camera area) corresponding to the camera module 510 may the second area 612 (e.g., the active area).

Since the camera module 510 is arranged under the display panel 520 in an under-display camera (UDC) manner, it is necessary to secure a transmittance in consideration of the quality of a captured image. To this end, the density of first pixels 622 arranged in the first area 611 (e.g., the under-display camera area) and the second pixels 664 arranged in the second area 612 (e.g., the active area) may be different from each other.

As an embodiment, compared to the number of second pixels 664 arranged in the second area 612 (e.g., the active area), the number of first pixels 662 area in the first area 611 (e.g., the under-display camera area) may be reduced to ½, ⅓, ¼, ⅕, or ⅙. The first pixels 662 may be arranged in an area of ½, ⅓, ¼, ⅕, or ⅙ of the total area of the first area 611 (e.g., the under-display camera area), and the remaining portion may be provided with empty areas 666 (or non-pixel areas) in which no pixels are present. The disclosure is not limited thereto, and a ratio of the first pixels 662 arranged in the first area 611 (e.g., the under-display camera area) may be changed.

Referring to FIG. 7, a bottom metal layer 5201 (BML) may be arranged under (e.g., in the −z-axis direction) the first pixels 662 of the first area 611 (e.g., the under-display camera area). As an embodiment, the bottom metal layer 5201 (e.g., BML) may be provided only under the first pixels 662 and may not be provided in the empty areas 666 (or the non-pixel areas). As another embodiment, the bottom metal layer 5201 (e.g., BML) may be provided under (e.g., in the −z-axis direction) at least some of the first pixels and under (e.g., in the −z-axis direction) at least some of the empty areas 666. As an embodiment, the bottom metal layer 5201 (e.g., BML) may be arranged under (e.g., in the −z-axis direction) of driving circuits (e.g., TFTs) configured to drive the plurality of organic light-emitting devices (e.g., TFTs) to overlap at least some of the driving circuits (e.g., TFTs).

FIG. 6 illustrates that the first pixels 662 of the first area 611 (e.g., the under-display camera area) are regularly arranged. Without being limited thereto, the first pixels 662 may be irregularly arranged in the first area 611 (e.g., the under-display camera area). As an embodiment, pixel densities of the central portion and the peripheral portion of the first area 611 (e.g., the under-display camera area) may be different from each other. For example, the central portion of the first area 611 (e.g., the under-display camera area) may have a higher density of pixels than the peripheral portion. As an embodiment, in order to reduce diffraction, intervals between pixels (or sub-pixels) in the first area 611 (e.g., the under-display camera area) may be irregularly arranged.

Referring to FIG. 6, a circular shape of the first area 611 (e.g., the under-display camera area) is illustrated as an example. However, without being limited thereto, the first area 611 (e.g., the under-display camera area) may be provided in an elliptical shape or a polygonal shape.

According to an embodiment, since a smaller number of first pixels 662 are arranged in the first area 611 (e.g., the under-display camera area) compared to the second area 612 (e.g., the active area), the first area 611 (e.g., the under-display camera area) and the second area 612 (e.g., the active area) may have different resolutions. As an embodiment, the resolution of the first area 611 (e.g., the under-display camera area) may be lower than that of the second area 612 (e.g., the active area).

According to an embodiment, the first driving circuits (e.g., TFTs) configured to drive the first pixels 662 arranged in the first area 611 (e.g., the under-display camera area) may be arranged in the second area 612. The second driving circuits (e.g., TFTs) configured to drive the second pixels 664 arranged in the second area 612 (e.g., the active area) may be arranged in the second area 612. Since the first pixels 662 are provided in the first area 611 (e.g., the under-display camera area) without the first driving circuits (e.g., TFTs), the first area 611 may have a higher light transmittance compared to the second area 612 (e.g., the active area).

Figure 8:
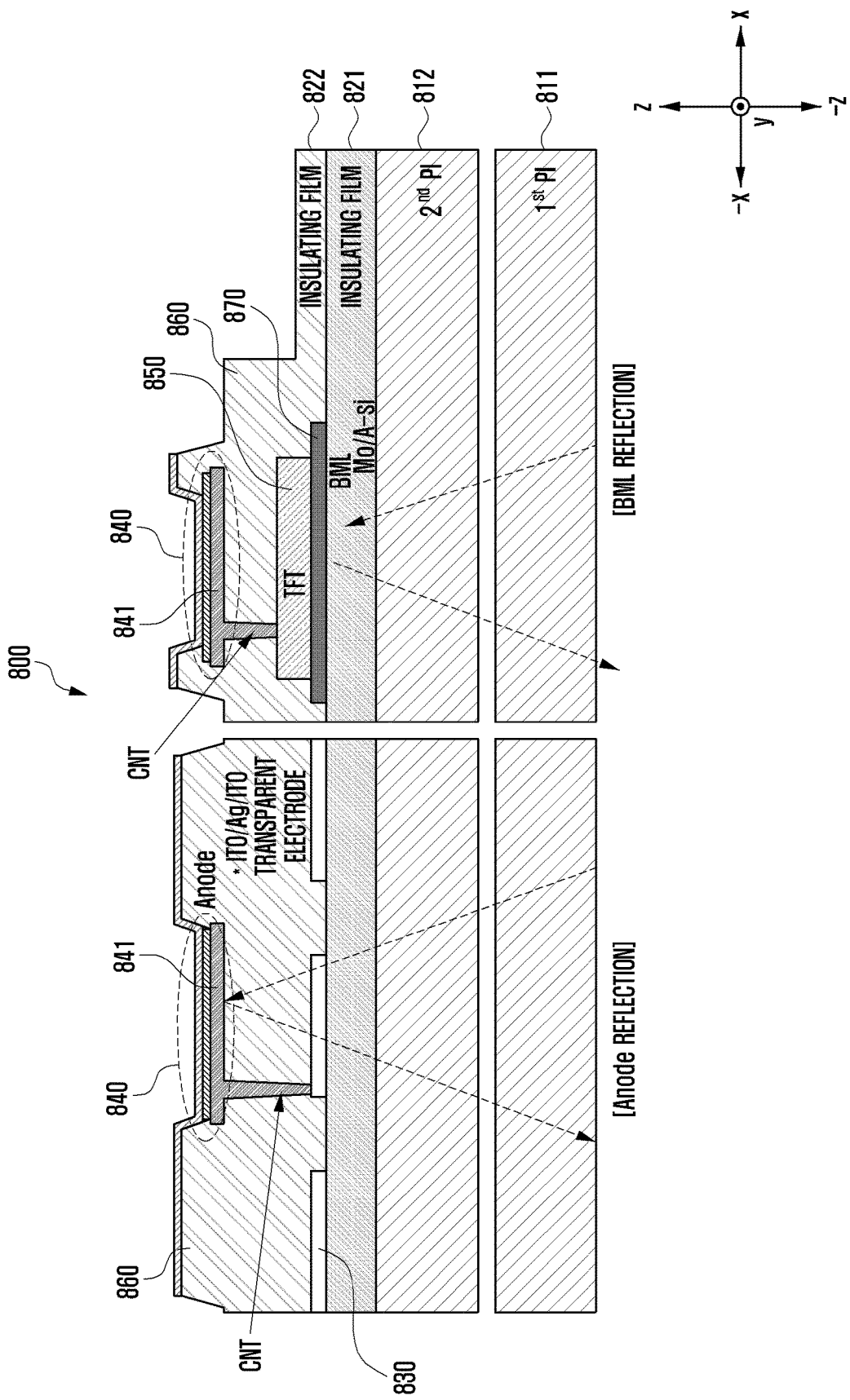
FIG. 8 is a view for describing that light incident on a display is reflected by a bottom metal layer (e.g., bottom metal layer (BML)) arranged under anode electrodes of organic light-emitting diodes (OLEDs) and thin film transistors (TFTs), resulting in occurrence of a light flare in the camera module according to an embodiment of the disclosure.

FIG. 8 is a view for describing that light incident on a display is reflected by a bottom metal layer (BML) arranged under anode electrodes of OLEDs and thin film transistors (TFTs), resulting in occurrence of a light flare in the camera module according to an embodiment of the disclosure.

Referring to FIG. 8, a display panel 800 may include a first substrate 811, a second substrate 812, a first insulating film 821, a second insulating film 822, a plurality of transparent wiring lines 830, a plurality of OLEDs 840, a plurality of TFTs 850, a pixel define layer 860, and a plurality of bottom metal layers 870 (e.g., bottom metal layers (BMLs)). As an embodiment, the first substrate 811 and the second substrate 812 may include polyimide (PI). The first insulating film 821 may include an inorganic layer.

The second insulating film 822 may include an organic layer. An area of each pixel may be defined by the pixel define layer 860. As an example, the pixel define layer 860 may include an organic material such as polyacrylates resin or polyimides resin, or a silica-based inorganic material. As an example, the pixel define layer 860 may include a light blocking material to block light. When the pixel define layer 860 includes a light blocking material, it is possible to prevent color mixing of light generated in an organic light-emitting layer of a pixel and light generated in the organic light-emitting layer of an adjacent pixel. For example, the pixel define layer 860 may include an opaque material and serve to block light.

As an embodiment, the anode electrode 841 of an OLED 840 and a TFT 850 may be electrically connected via a contact portion (CNT). In order to prevent light from being incident on the lower portion of the TFT 850, a bottom metal layer 870 (e.g., BML) may be arranged under (e.g., in the −z-axis direction) the TFT 850. The bottom metal layer 870 may be arranged to overlap the TFT 850. FIG. 8 illustrates an example in which the bottom metal layer 870 is arranged directly under (e.g., in the −z-axis direction) the TFT 850. As another example, the bottom metal layer 870 may be arranged on any one of the layers under (e.g., in the −z-axis direction) the TFT 850.

As an embodiment, after light incident on the display is reflected by a structure (e.g., a metal wiring line or a camera module) under the display, the light may be reflected from the anode electrode 841 of an OLED 840 to be incident on the camera module (e.g., the camera module 510 in FIG. 5). When the light reflected from the inside of the display panel 800 is incident on the camera module (e.g., the camera module 510 in FIG. 5), a light flare may occur.

As an embodiment, after light incident on the display is reflected by a structure (e.g., a metal wiring line) under the display, the light may be reflected by the bottom metal layer 870 (e.g., bottom metal layer (BML)) arranged under (e.g., in the −z-axis direction) a TFT 850 to be incident on the camera module (e.g., the camera module 510 in FIG. 5). When the light reflected from the inside of the display panel 800 is incident on the camera module (e.g., the camera module 510 in FIG. 5), a light flare may occur.

In order to prevent the occurrence of a light flare in the camera module (e.g., the camera module 510 in FIG. 5), it is necessary to block light reflection inside the display panel 800.

Figure 9:
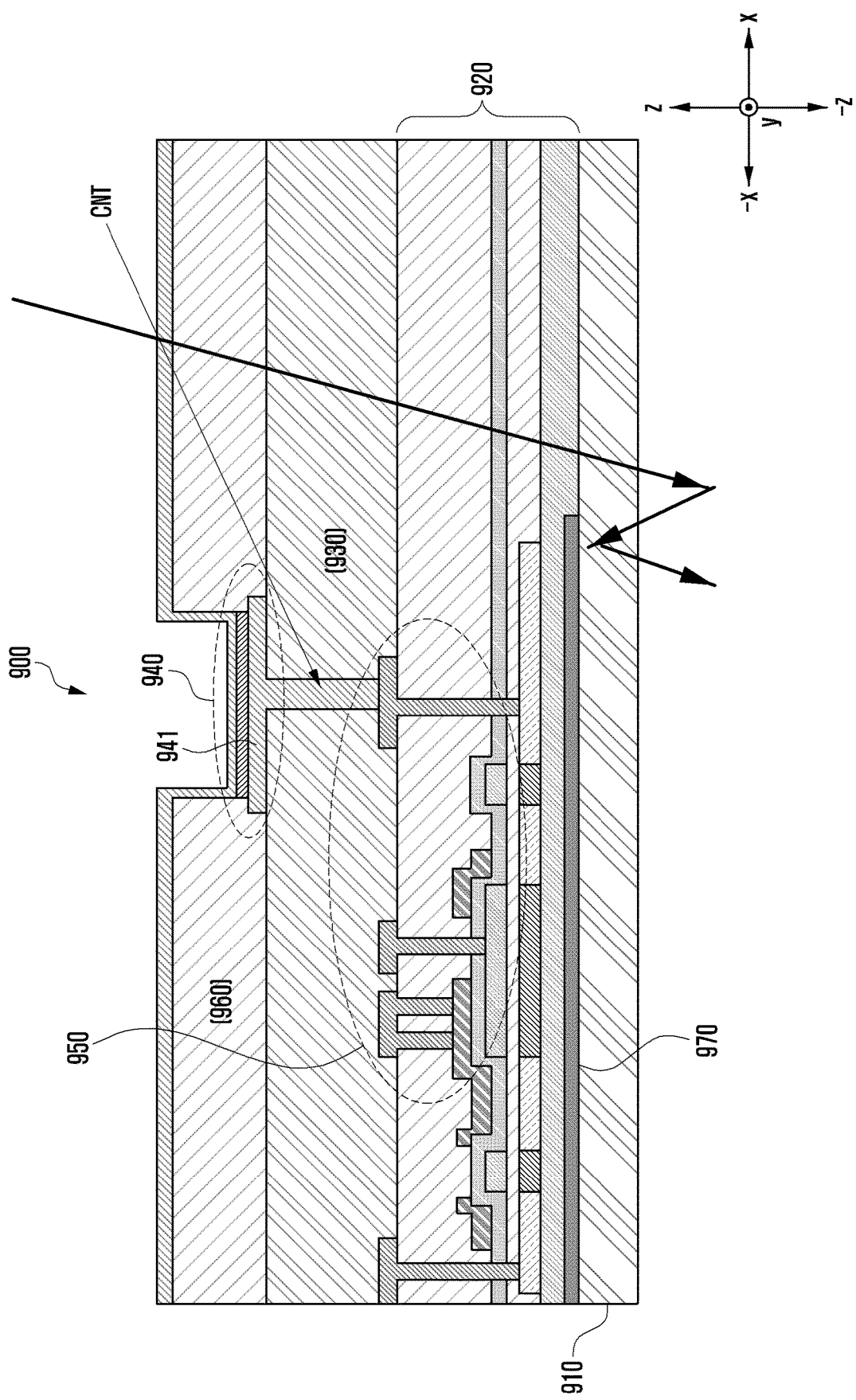
FIG. 9 is a view for describing that light incident on a display is reflected by a bottom metal layer (e.g., bottom metal layer (BML)) arranged under thin film transistors (TFTs), resulting in occurrence of a light flare in the camera module according to an embodiment of the disclosure.

FIG. 9 is a view for describing that light incident on a display is reflected by a bottom metal layer (e.g., bottom metal layer (BML)) arranged under thin film transistors (TFTs), resulting in occurrence of a light flare in the camera module according to an embodiment of the disclosure.

Referring to FIG. 9, a display panel 900 may include a substrate 910, a plurality of insulating films 920, a planarization layer 930, a plurality of OLEDs 940, a plurality of TFTs 950, a pixel define layer 960, and a plurality of bottom metal layers 970 (e.g., bottom metal layers (BMLs)).

As an embodiment, an area of each pixel may be defined by the pixel define layer 960. The anode electrode 941 of an OLED 940 and a TFT 950 may be electrically connected via a contact portion CNT. In order to prevent light from being incident on the lower portion of the TFT 950, a bottom metal layer 970 (e.g., BML) may be arranged under (e.g., in the −z-axis direction) the TFT 950.

As an embodiment, after light incident on the display is reflected by a structure (e.g., a metal wiring line) under the display, the light may be reflected by the bottom metal layer 970 (e.g., bottom metal layer (BML)) arranged under (e.g., in the −z-axis direction) a TFT 950 to be incident on the camera module (e.g., the camera module 510 in FIG. 5). When the light reflected from the inside of the display panel 900 is incident on the camera module (e.g., the camera module 510 in FIG. 5), a light flare may occur.

As an embodiment, the planarization layer 930 may include a plurality of insulating layers (e.g., a plurality of insulating films). In order to prevent occurrence of a light flare from the camera module (e.g., the camera module 510 in FIG. 5), it is necessary to block light reflection inside the display panel 900.

Figure 10:
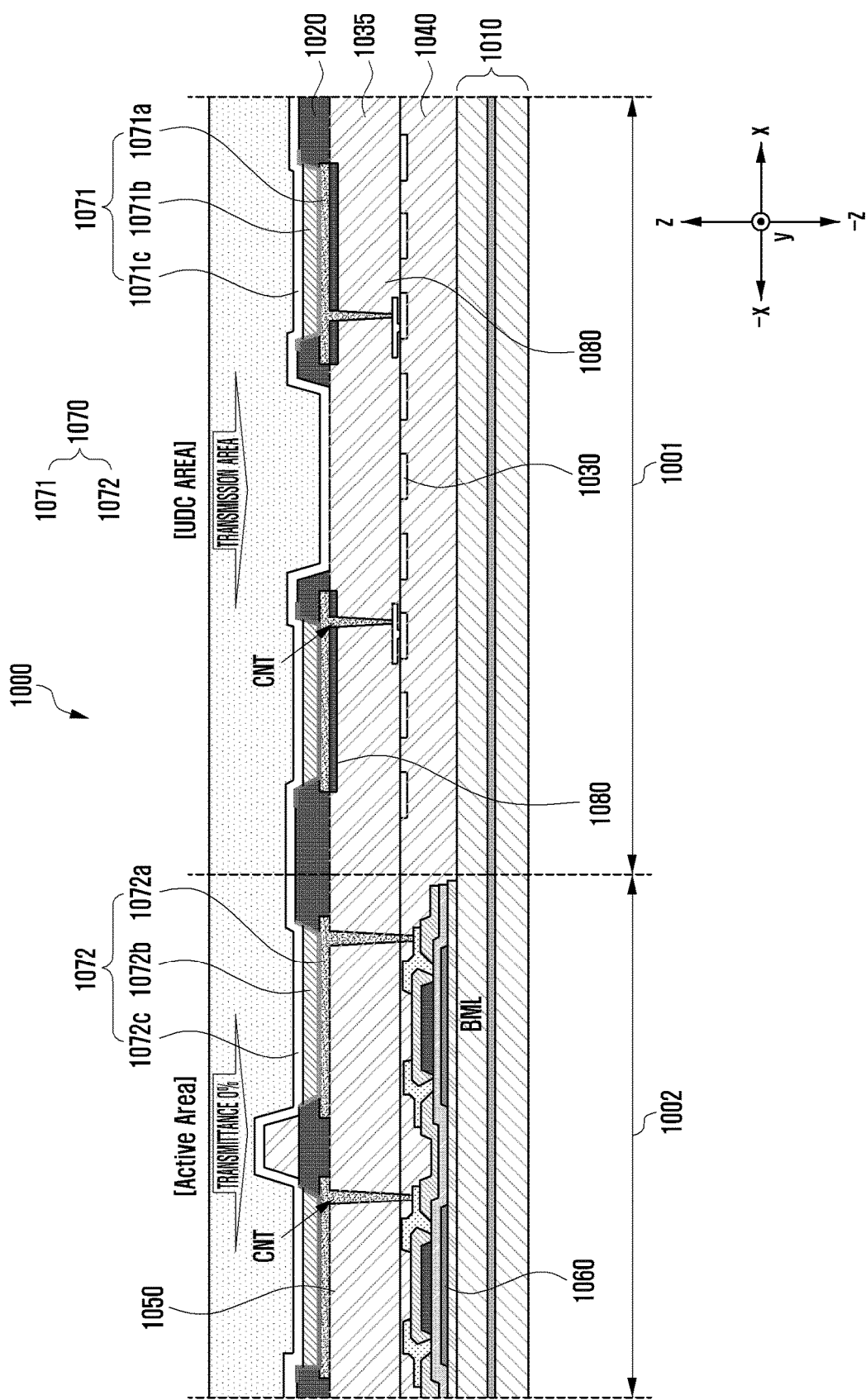
FIG. 10 is a view illustrating a structure of a display panel of an electronic device according to an embodiment of the disclosure.

FIG. 10 is a view illustrating a structure of a display panel of an electronic device according to an embodiment of the disclosure.

Referring to FIG. 10, a display panel 1000 of an electronic device (e.g., the electronic device 200 in FIG. 2A or the electronic device 300 in FIG. 3A) according to various embodiments of the disclosure may include a first area 1001 (e.g., an under-display camera area) and a second area 1002 (e.g., an active area). The density of pixels in the first area 1001 (e.g., the under-display camera area) may be different from the density of pixels in the second area 1002 (e.g., the active area). The display panel 1000 according to various embodiments of the disclosure may include a substrate 1010, a pixel define layer 1020 (PDL) or a black PDL, a plurality of transparent wiring lines 1030, a planarization layer 1035, a plurality of insulating films 1040, a plurality of TFTs 1050, a plurality of bottom metal layers 1060 (e.g., bottom metal layers (BMLs)), a plurality of OLEDs 1070, and a plurality of light reflection blocking layers 1080.

As an embodiment, the planarization layer 1035 may include a plurality of insulating layers (e.g., a plurality of insulating films). As an embodiment, the area of each pixel may be defined by the pixel define layer 1020 (PDL) or a black PDL. As an example, the pixel define layer 1020 may include an organic material such as polyacrylates resin or polyimides resin, or a silica-based inorganic material. As an example, the pixel define layer 1020 may include a light blocking material to block light. When the pixel define layer 1020 includes a light blocking material, it is possible to prevent color mixing of light generated in an organic light-emitting layer of a pixel and light generated in the organic light-emitting layer of an adjacent pixel. For example, the pixel define layer 1020 may include an opaque material and serve to block light.

As an embodiment, the plurality of OLEDs 1070 may include a plurality of first OLEDs 1071 and a plurality of second OLEDs 1072. The plurality of first OLEDs 1071 may be arranged in the first area 1101 (e.g., the under-display camera area). The plurality of second OLEDs 1072 may be arranged in the second area 1102 (e.g., the active area). As an example, each first OLED 1071 may include an anode electrode 1071a, a light-emitting layer 1071b, and a cathode electrode 1071c. As an example, each second OLED 1072 may include an anode electrode 1072a, a light-emitting layer 1072b, and a cathode electrode 1072c.

As an embodiment, the anode electrodes 1071a of the first OLEDs 1071 and the TFTs may be electrically connected to each other via contact portions CNT. In order to prevent light from being incident on the lower portions of the anode electrodes 1071a, the plurality of light reflection blocking layers 1080 may be arranged under the anode electrodes 1071a.

As an embodiment, the anode electrodes 1072a of the second OLEDs 1072 and the TFTs 1050 may be electrically connected to each other via contact portions CNT. In order to prevent light from being incident on the lower portions of the TFTs 1050, bottom metal layers 1060 may be arranged under the TFTs 1050.

As another embodiment, when a polarizing film or a polarizing plate is arranged, a pixel define layer (PDL) may be arranged in place of a black PDL arranged in a light-emitting layer.

As an embodiment, in order to prevent the occurrence of a light flare in the camera module (e.g., the camera module 510 in FIG. 5), a plurality of light reflection blocking layers 1080 configured to block reflection of light incident on the first area 1001 (e.g., the under-display camera area) of the display panel 1000 may be arranged.

As an embodiment, the plurality of light reflection blocking layers 1080 may be arranged under the anode electrodes 1071a of the first OLEDs 1071 of pixels provided in the first area 1001 (e.g., the under-display camera area).

As an embodiment, in the first area 1001 (e.g., the under-display camera area), the plurality of light reflection blocking layers 1080 may not be provided in the areas between the first OLEDs 1171.

As an embodiment, the light reflection blocking layers 1080 may not be provided under the second OLEDs 1172 of the pixels provided in the second area 1002 (e.g., the active area). As another embodiment, when the light reflection blocking layers 1080 are provided in the first area 1001 (e.g., the under-display camera area), the light reflection blocking layers 1080 may also be provided in the second area 1002 (e.g., the active area). In the second area 1002 (e.g., the active area), light reflection blocking layers 1080 may be selectively provided.

As an embodiment, the pixel define layer 1020 (PDL) or a black PDL may be formed as one layer.

As an embodiment, the light reflection blocking layers 1080 may be arranged between the lower portions of the OLEDs 1070a and the plurality of transparent wire lines 1030 in the first area 1001 (e.g., the under-display camera area). However, without being limited thereto, the light reflection blocking layers 1080 may be arranged under the plurality of transparent wire lines 1030 in the first area 1001 (e.g., the under-display camera area).

As an embodiment, the light reflection blocking layers 1080 may be arranged at the top, bottom, or center of the planarization layer 1135. For example, a plurality of planarization layers 1135 may be provided, and the light reflection blocking layers 1080 may be provided at the top, center, or the bottom of the plurality of layers.

For example, at least one light reflection blocking layer may be provided in a plurality of layers forming the planarization layer.

For example, it may be advantageous for the light reflection blocking layers 1080 to be arranged directly under the first OLEDs 1171 to block light reflection. Without being limited thereto, the light reflection blocking layers 1080 may be located in any one of the layers below (e.g., in the −z-axis direction) of the first OLEDs 1171. The widths of the light reflection blocking layers 1080 may increase downward (e.g., in the −z-axis direction). As another example, the plurality of light reflection blocking layers 1080 may be arranged in a plurality of layers.

As an embodiment, the light reflection blocking layers 1080 may be formed of the same material as the pixel define layer 1020 (e.g., pixel define layer (PDL) or a black PDL. As another embodiment, the light reflection blocking layers 1080 may be formed of a material different from that of the pixel define layer 1020 (PDL) or a black PDL.

As an embodiment, the light reflection blocking layers 1080 may include an opaque organic layer and have a reflectance of about 4% or less.

As an embodiment, in order to prevent the occurrence of light reflection from the anode electrodes 1071a of the first OLEDs 1171, the light reflection blocking layers 1080 may have a width equal to or greater than the width of the anode electrodes 1071a.

In an electronic device (e.g., the electronic device 200 in FIG. 2A or the electronic device 300 in FIG. 3A) according to various embodiments of the disclosure, by arranging the light reflection blocking layers 1080 under the anode electrodes 1071a in the first area 1001 (e.g., the under-display camera area) of the display panel 1000, it is possible to prevent light incident on the display from being reflected. By preventing light incident on the inside of the display panel 1000 from being incident on the camera module (e.g., the camera module 510 in FIG. 5), it is possible to prevent the occurrence of a light flare.

Figure 11:
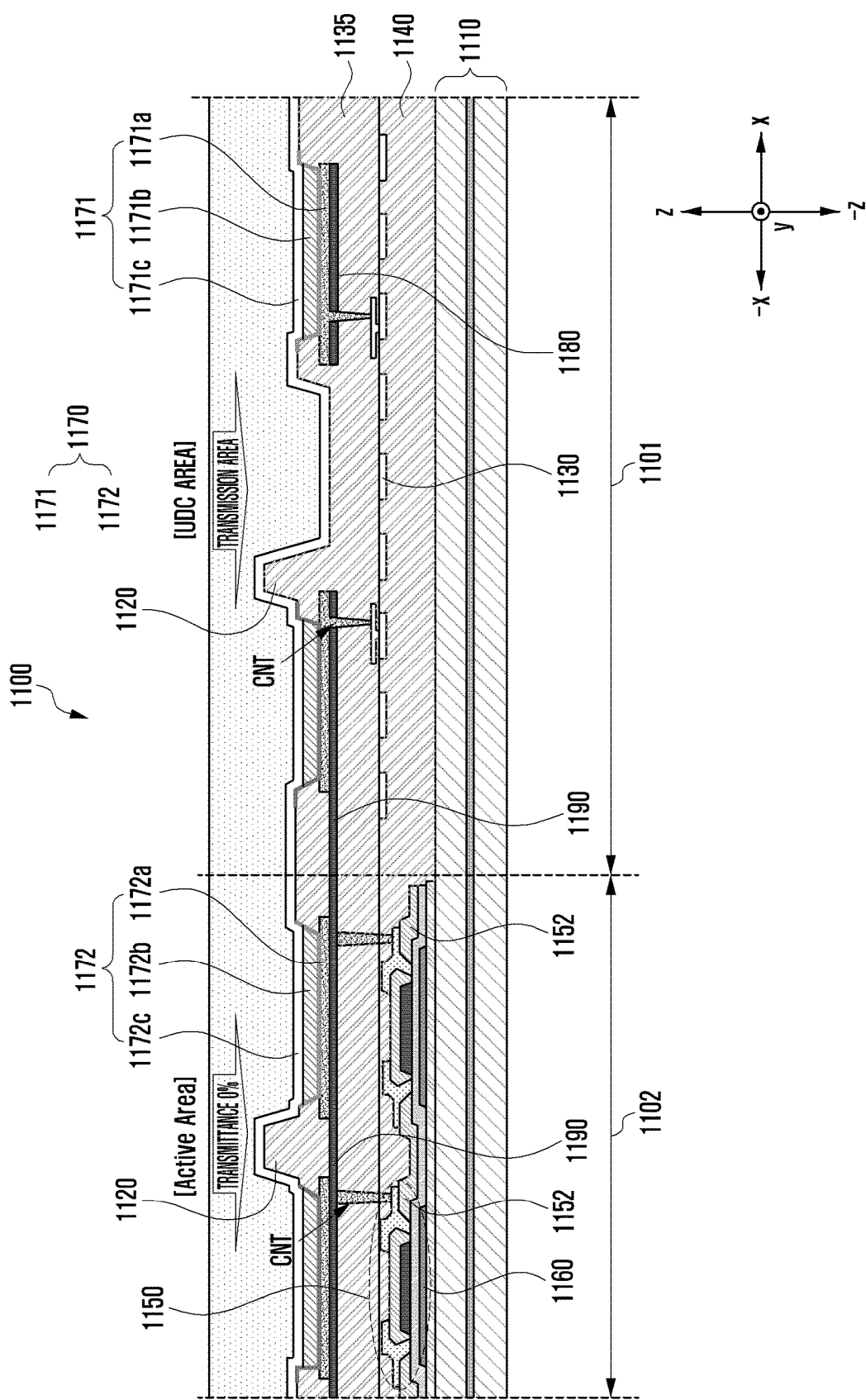
FIG. 11 is a view illustrating a structure of a display panel of an electronic device according to an embodiment of the disclosure.

FIG. 11 is a view illustrating a structure of a display panel of an electronic device according to an embodiment of the disclosure.

Referring to FIG. 11, a display panel 1100 of an electronic device (e.g., the electronic device 200 in FIG. 2A or the electronic device 300 in FIG. 3A) according to various embodiments of the disclosure may include a first area 1101 (e.g., an under-display camera area) and a second area 1102 (e.g., an active area). The density of pixels in the first area 1101 (e.g., the under-display camera area) may be different from the density of pixels in the second area 1102 (e.g., the active area). The display panel 1100 according to various embodiments of the disclosure may include a substrate 1110, a pixel define layer 1120 (PDL) or a black PDL, a plurality of transparent wiring lines 1130, a planarization layer 1135, a plurality of insulating films 1140, a plurality of TFTs 1150, a plurality of bottom metal layers 1160 (e.g., bottom metal layers (BMLs)), a plurality of OLEDs 1170, and a plurality of light reflection blocking layers 1180 and 1190.

As an embodiment, the plurality of light reflection blocking layers 1180 and 1190 may include a plurality of first light reflection blocking layers 1180 arranged in the first area 1101 (e.g., the under-display camera area), and a plurality of second light reflection blocking layers 1190 arranged in the second area 1102 (e.g., the active area). According to an embodiment, some of the second light reflection blocking layers 1190 arranged in the second area 1102 (e.g., the active area) may extend to the first area 1101. For example, the second light reflection blocking layers 1190 may be provided to extend to the first area 1101 and overlap anodes provided at the outermost among the plurality of anode electrodes provided in the first area 1101. As an example, the second light reflection blocking layers 1190 may be arranged under (e.g., in the z-axis direction) anodes provided at the outermost among the plurality of anode electrodes provided in the first area 1101. As an embodiment, in order to prevent reflection of external light, the second light reflection blocking layers 1190 may be arranged between the anode electrodes 1172a of the second OLEDs 1172 and the sources/drains 1152 of the TFTs 1150.

As an embodiment, the planarization layer 1135 may include a plurality of insulating layers (e.g., a plurality of insulating films).

As an embodiment, the area of each pixel may be defined by the pixel define layer 1120 (PDL) or a black PDL.

As an example, the pixel define layer 1120 may include an organic material such as polyacrylates resin or polyimides resin, or a silica-based inorganic material. As an example, the pixel define layer 1120 may include a light blocking material to block light. When the pixel define layer 1120 includes a light blocking material, it is possible to prevent color mixing of light generated in an organic light-emitting layer of a pixel and light generated in the organic light-emitting layer of an adjacent pixel. For example, the pixel define layer 1120 may include an opaque material and serve to block light.

As an embodiment, the plurality of OLEDs 1170 may include a plurality of first OLEDs 1171 and a plurality of second OLEDs 1172. The plurality of first OLEDs 1171 may be arranged in the first area 1101 (e.g., the under-display camera area). The plurality of second OLEDs 1172 may be arranged in the second area 1102 (e.g., the active area). As an example, each first OLED 1171 may include an anode electrode 1171a, a light-emitting layer 1171b, and a cathode electrode 1171c. As an example, each second OLED 1172 may include an anode electrode 1172a, a light-emitting layer 1172b, and a cathode electrode 1172c.

As an embodiment, the anode electrodes 1171a of the OLEDs 1171 and the TFTs 1150 may be electrically connected to each other via contact portions CNT. In order to prevent light from being incident on the lower portions of the TFTs, first light reflection blocking layers 1180 may be arranged under the anode electrodes 1171a.

As an embodiment, the anode electrodes 1172a of the second OLEDs 1172 and the TFTs 1150 may be electrically connected to each other via contact portions CNT. In order to prevent light from being incident on the lower portions of the TFTs 1150, bottom metal layers 1160 (e.g., BMLs) may be arranged under the TFTs 1150.

According to an embodiment, in order to prevent the occurrence of a light flare in the camera module (e.g., the camera module 510 in FIG. 5), a plurality of first light reflection blocking layers 1180 configured to block reflection of light incident on the first area 1101 (e.g., the under-display camera area) of the display panel 1100 may be arranged. As an example, the plurality of first light reflection blocking layers 1180 may be arranged under the plurality of first OLEDs 1171 of pixels provided in the first area 1101 (e.g., the under-display camera area). As an example, the plurality of first light reflection blocking layers 1180 may be arranged under the anode electrodes 1171a of the first OLEDs 1171 of the pixels provided in the first area 1101 (e.g., the under-display camera area) to block light reflection from the anode electrodes 1171a.

As an embodiment, in the first area 1101 (e.g., the under-display camera area), the plurality of first light reflection blocking layers 1180 may not be provided in the areas between the first OLEDs 1171.

As an embodiment, in the case in which a single pixel define layer 1120 (PDL) or a black PDL is provided in a polarizing film or polarizing plate-free (pol-less) structure, the plurality of first light reflection blocking layers 1180 may be arranged between the lower portions of the first OLEDs 1171 and the plurality of transparent wiring lines 1130 in the first area 1101 (e.g., the under-display camera area). However, without being limited thereto, the plurality of first light reflection blocking layers 1180 may be arranged under the plurality of transparent wiring lines 1130 in the first area 1101 (e.g., the under-display camera area).

As an embodiment, the plurality of first light reflection blocking layers 1180 may be arranged at the top, bottom, or center of a plurality of insulating films 1140.

As an embodiment, the plurality of first light reflection blocking layers 1180 may be formed of the same material as the pixel define layer 1120 (e.g., pixel define layer (PDL) or a PDL. As another embodiment, the plurality of first light reflection blocking layers 1180 may be formed of a material different from that of the pixel define layer 1120 (e.g., pixel define layer (PDL) or a black PDL.

As an embodiment, the plurality of first light reflection blocking layers 1180 may include an opaque organic layer and have a reflectance of about 4% or less.

As an embodiment, in order to prevent the occurrence of light reflection from the anode electrodes 1171a of the first OLEDs 1171, the plurality of light reflection blocking layers 1180 may have a width equal to or greater than the width of the anode electrodes 1171a.

According to an embodiment, in order to prevent the occurrence of a light flare in the camera module (e.g., the camera module 510 in FIG. 5), second light reflection blocking layers 1190 configured to block reflection of light incident on the second area 1102 (e.g., the active area) of the display panel 1100 may be arranged. As an example, the second light reflection blocking layers 1190 may be arranged under the plurality of second OLEDs 1172 of the pixels provided in the second area 1102 (e.g., the active area). For example, the second light reflection blocking layers 1190 may be arranged under the anode electrodes 1172a of the second OLEDs 1172 of the pixels provided in the second area 1102 (e.g., the active camera area) to block light reflection from the anode electrodes 1172a. For example, the second light reflection blocking layers 1190 may be arranged to overlap the entire lower portions of the second OLEDs 1172 of the pixels provided in the second area 1102 (e.g., the active area).

As an embodiment, in the case in which a single pixel define layer 1120 (PDL) or a black PDL is provided in a polarizing plate-free (pol-less) structure, the second light reflection blocking layers 1190 may be arranged between the lower portions of the second OLEDs 1172 and the TFTs 1150 in the second area 1102 (e.g., the active area). As an embodiment, the second light reflection blocking layers 1190 may be arranged at the top, bottom, or center of a plurality of insulating films 1140.

As an embodiment, the second light reflection blocking layers 1190 may be formed of the same material as the pixel define layer 1120 (e.g., pixel define layer (PDL) or a black PDL. As another embodiment, the second light reflection blocking layers 1190 may be formed of a material different from that of the pixel define layer 1120 (e.g., pixel define layer (PDL) or a black PDL.

As an embodiment, the second light reflection blocking layers 1190 may include an opaque organic layer and have a reflectance of about 4% or less.

As an embodiment, in order to prevent the occurrence of light reflection from the anode electrodes 1172a of the second OLEDs 1172, the second light reflection blocking layers 1190 may have a width equal to or greater than the width of the anode electrodes 1172a.

As an embodiment, the second light reflection blocking layers 1190 may be arranged to extend not only to the second area 1102 (e.g., the active area), but also to the first area 1101 (e.g., the under-display camera area).

In the electronic device (e.g., the electronic device 200 in FIG. 2A or the electronic device 300 in FIG. 3A) according to various embodiments of the disclosure, by arranging the first light reflection blocking layers 1180 under the anode electrodes 1171a in the first area 1101 (e.g., the under-display area) of the display panel 1100 and arranging the second light reflection blocking layer 1190 under the anode electrodes 1172a in the second area 1102 (e.g., the active area), it is possible to prevent light incident on the display from being reflected. By preventing light incident on the inside of the display panel 1100 from being incident on the camera module (e.g., the camera module 510 in FIG. 5), it is possible to prevent the occurrence of a light flare.

Figure 12:
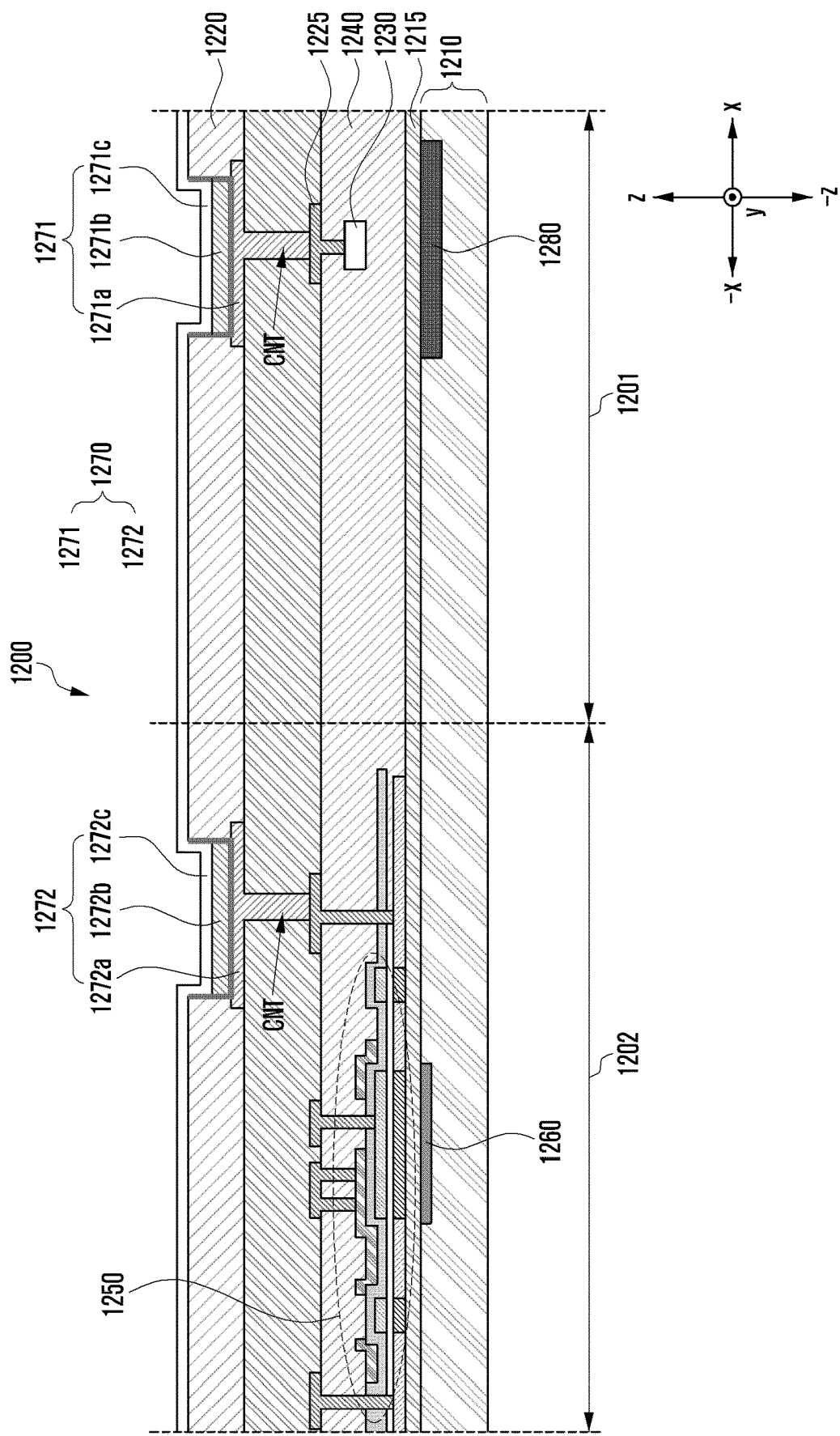
FIG. 12 is a view illustrating a structure of a display panel of an electronic device according to an embodiment of the disclosure.

FIG. 12 is a view illustrating a structure of a display panel of an electronic device according to an embodiment of the disclosure.

Referring to FIG. 12, a display panel 1200 of an electronic device (e.g., the electronic device 200 in FIG. 2A or the electronic device 300 in FIG. 3A) according to various embodiments of the disclosure may include a first area 1201 (e.g., an under-display camera area) and a second area 1202 (e.g., an active area). The density of pixels in the first area 1201 (e.g., the under-display camera area) may be different from the density of pixels in the second area 1202 (e.g., the active area). The display panel 1200 according to various embodiments of the disclosure may include a substrate 1210, a pixel define layer 1220 (PDL) or a PDL, a plurality of transparent wiring lines 1230, a plurality of insulating films 1240, a plurality of TFTs 1250, a plurality of bottom metal layers 1260 (e.g., bottom metal layers (BMLs)), a plurality of OLEDs 1270, and a plurality of light reflection blocking layers 1280.

As an embodiment, the plurality of light reflection blocking layers 1280 may be arranged in the first area 1201 (e.g., the under-display camera area).

As an embodiment, the area of each pixel may be defined by the pixel define layer 1220 (PDL) or a black PDL. As an example, the pixel define layer 1220 may include an organic material such as polyacrylates resin or polyimides resin, or a silica-based inorganic material. As an example, the pixel define layer 1220 may include a light blocking material to block light. When the pixel define layer 1220 includes a light blocking material, it is possible to prevent color mixing of light generated in an organic light-emitting layer of a pixel and light generated in the organic light-emitting layer of an adjacent pixel. For example, the pixel define layer 1220 may include an opaque material and serve to block light.

As an embodiment, the plurality of OLEDs 1270 may include a plurality of first OLEDs 1271 and a plurality of second OLEDs 1272. The plurality of first OLEDs 1271 may be arranged in the first area 1201 (e.g., the under-display camera area). The plurality of second OLEDs 1272 may be arranged in the second area 1202 (e.g., the active area). As an example, each first OLED 1271 may include an anode electrode 1271a, a light-emitting layer 1271b, and a cathode electrode 1271c. As an example, each second OLED 1272 may include an anode electrode 1272a, a light-emitting layer 1272b, and a cathode electrode 1272c.

As an embodiment, the plurality of anode electrodes 1271a of the plurality of first OLEDs 1271 and the TFTs may be electrically connected to each other via contact portions CNT. In order to prevent light from being incident on the lower portions of the plurality of first OLEDs 1271 provided in the first area 1201 (e.g., the under-display camera area), a plurality of light reflection blocking layer 1280 may be arranged under the plurality of first OLEDs 1271.

As an embodiment, the anode electrodes 1272a of the second OLEDs 1272 and the TFTs 1250 may be electrically connected to each other via contact portions CNT. In order to prevent light from being incident on the lower portions of the TFTs 1250 provided in the second area 1202 (e.g., the active area), bottom metal layers 1260 may be arranged under the TFTs 1250.

According to an embodiment, in order to prevent the occurrence of a light flare in the camera module (e.g., the camera module 510 in FIG. 5), a plurality of light reflection blocking layers 1280 configured to block reflection of light incident on the first area 1201 (e.g., the under-display camera area) of the display panel 1200 may be arranged. As an example, the plurality of light reflection blocking layers 1280 may be arranged under the first OLEDs 1271 of pixels provided in the first area 1201 (e.g., the under-display camera area). As an example, the plurality of light reflection blocking layers 1280 may be arranged under the anode electrodes 1271a of the first OLEDs 1271 of the pixels provided in the first area 1201 (e.g., the under-display camera area) to block light reflection from the anode electrodes 1271a. As an embodiment, in the first area 1201 (e.g., the under-display camera area), the plurality of light reflection blocking layers 1280 may not be provided in the areas between the first OLEDs 1271.

As an embodiment, in the case in which a single pixel define layer 1220 (PDL) or a black PDL is provided in a polarizing plate-free (pol-less) structure, the plurality of light reflection blocking layers 1280 may be arranged under the plurality of transparent wiring lines 1230 in the first area 1201 (e.g., the under-display camera area).

For example, since the light reflection blocking layers 1280 are arranged on a display substrate, the light reflection blocking layers 1280 may be made of a material different from those of the light reflection blocking layers 1080 in FIG. 10 and the first light reflection blocking layers 1180 and the second light reflection blocking layers 1190 of FIG. 11, and may be provided at a different position.

As an example, the light reflection blocking layers 1280 may be arranged below the TFTs.

As an example, the material of the light reflection blocking layers 1280 may include at least one metal layer, and the materials of the light reflection blocking layer 1080 of FIG. 10, the first light reflection blocking layer 1180 of FIG. 11, and the second light reflection blocking layer 1190 may be an opaque organic material.

As an example, the anode electrodes 1271a of the first OLEDs 1271 and the contact portions CNT may be electrically connected to each other. The contact portions CNT and the plurality of transparent wiring lines 1230 may be electrically connected to each other. Bridge wiring lines 1225 for connecting the contact parts CNT and the plurality of transparent wiring lines 1230 may be provided between the contact portions CNT and the plurality of transparent wiring lines 1230.

As an embodiment, the plurality of light reflection blocking layers 1280 may be arranged at the bottom of the plurality of insulating films 1240. As an embodiment, a layer 1215 may be provided between insulating films 1240 and substrate 1210.

As an embodiment, the plurality of light reflection blocking layers 1280 provided in the first area 1201 (e.g., the under-display camera area) may be provided in substantially the same height as the bottom metal layer 1260 provided in the second area 1202 (e.g., the active area), in the vertical direction (e.g., the z-axis direction).

As an embodiment, the plurality of light reflection blocking layers 1280 may be formed of the same material as the bottom metal layer 1260. As another embodiment, the plurality of light reflection blocking layers 1280 may be formed of a material different from that of the bottom metal layer 1260.

As an embodiment, the bottom metal layer 1260 may be provided as a single metal layer.

As an embodiment, the plurality of light reflection blocking layers 1280 may be provided in multiple layers (e.g., in a form in which a metal layer and a non-metal layer are stacked).

As an embodiment, in order to prevent the occurrence of light reflection from the anode electrodes 1271*a* of the second OLEDs 1271, the plurality of light reflection blocking layers 1280 may have a width equal to or greater than the width of the anode electrodes 1271*a*.

In an electronic device (e.g., the electronic device 200 in FIG. 2A or the electronic device 300 in FIG. 3A) according to various embodiments of the disclosure, by arranging the light reflection blocking layers 1280 under the anode electrodes 1271*a* in the first area 1201 (e.g., the under-display camera area) of the display panel 1200, it is possible to prevent light incident on the display from being reflected. By preventing light incident on the inside of the display panel 1200 from being incident on the camera module (e.g., the camera module 510 in FIG. 5), it is possible to prevent the occurrence of a light flare.

Figure 13:
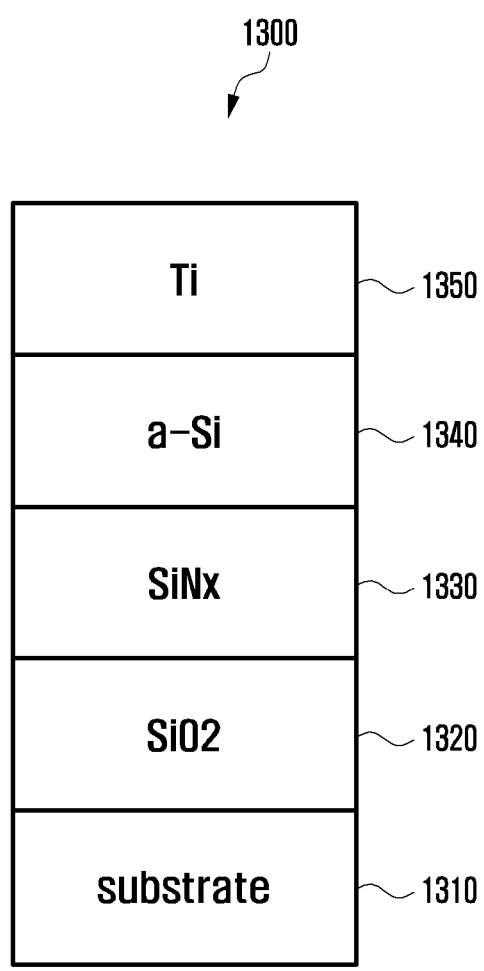
FIG. 13 is a view illustrating a configuration of a light reflection blocking layer according to an embodiment of the disclosure.

FIG. 13 is a view illustrating a configuration of a light reflection blocking layer according to an embodiment of the disclosure.

Referring to FIG. 13, a plurality of light reflection blocking layers 1300 (e.g., the plurality of light reflection blocking layers 1280 in FIG. 12) according to various embodiments of the disclosure may be provided. As an embodiment, the light reflection blocking layers 1300 may be provided by laminating a plurality of layers using a low-temperature polycrystalline silicon (LTPS) or low-temperature polycrystalline oxide (LTPO) process that forms a TFT (e.g., the TFTs 1250 in FIG. 12).

According to an embodiment, the light reflection blocking layers 1300 (e.g., the plurality of light reflection blocking layers 1280 in FIG. 12) may include a substrate 1310, an oxide film 1320, a nitride film 1330, a silicon film 1340, and a metal layer 1350. For example, the light reflection blocking layers 1300 may include a plurality of layers and have a light reflectance of about 5.2%.

As an embodiment, the oxide film 1320 may include a silicon oxide film ($SiO_2$). As an example, the oxide film 1320 may have a thickness of about 910 angstroms (Å).

As an embodiment, the nitride film 1330 may include a silicon nitride film ($SiN_x$). As an example, the nitride film 1330 may have a thickness of about 480 angstroms (Å).

As an embodiment, the silicon film 1340 may include amorphous silicon (a-Si). As an example, the silicon film 1340 may have a thickness of about 150 angstroms (Å).

As an embodiment, the metal layer 1350 may include titanium (Ti) or a titanium alloy. As an example, the metal layer 1350 may have a thickness of about 1200 angstroms (Å).

Figure 14:
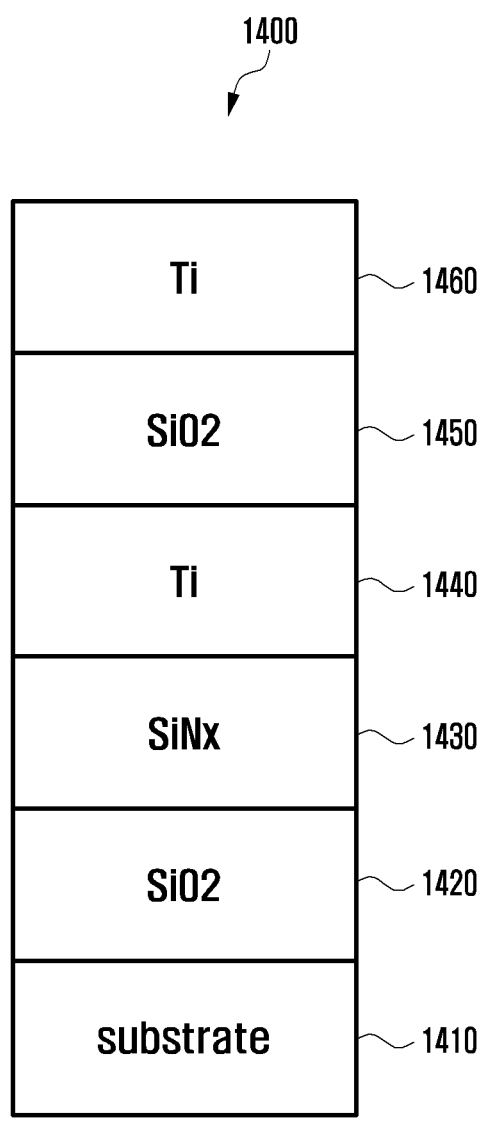
FIG. 14 is a view illustrating a configuration of a light reflection blocking layer according to an embodiment of the disclosure.

FIG. 14 is a view illustrating a configuration of a light reflection blocking layer according to an embodiment of the disclosure.

Referring to FIG. 14, a plurality of light reflection blocking layers 1400 (e.g., the plurality of light reflection blocking layers 1280 in FIG. 12) according to various embodiments of the disclosure may be provided. As an embodiment, the light reflection blocking layers 1400 may be provided by laminating a plurality of layers using a LTPS or LTPO process that forms a TFT (e.g., the TFTs 1250 in FIG. 12).

According to an embodiment, the light reflection blocking layer 1400 (e.g., the plurality of light reflection blocking layers 1280 of FIG. 12) may include a substrate 1410, a first oxide film 1420, a nitride film 1430, a first metal layer 1440, a second oxide film 1450, and a second metal layer 1460. For example, the light reflection blocking layers 1400 may include a plurality of layers and have a light reflectance of about 4.4%.

As an embodiment, the first oxide film 1420 may include a silicon oxide film ($SiO_2$). As an example, the first oxide film 1420 may have a thickness of about 1290 angstroms (Å).

As an embodiment, the nitride film 1430 may include a silicon nitride film ($SiN_x$). As an example, the nitride film 1430 may have a thickness of about 490 angstroms (Å).

As an embodiment, the first metal layer 1440 may include titanium (Ti) or a titanium alloy. As an example, the first metal layer 1440 may have a thickness of about 110 angstroms (Å).

As an embodiment, the second oxide film 1450 may include a silicon oxide film ($SiO_2$). As an example, the second oxide film 1450 may have a thickness of about 910 angstroms (Å).

As an embodiment, the second metal layer 1460 may include titanium (Ti) or a titanium alloy. As an example, the second metal layer 1460 may have a thickness of about 1200 angstroms (Å).

Figure 15:
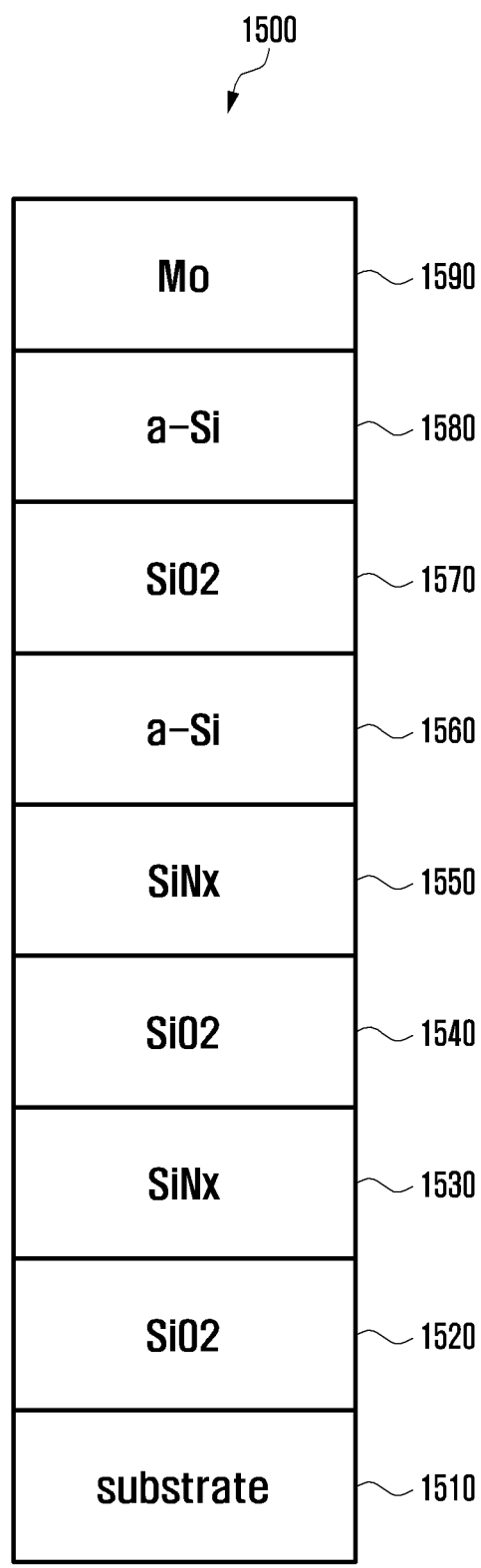
FIG. 15 is a view illustrating a configuration of a light reflection blocking layer according to an embodiment of the disclosure.

FIG. 15 is a view illustrating a configuration of a light reflection blocking layer according to an embodiment of the disclosure.

Referring to FIG. 15, a plurality of light reflection blocking layers 1500 (e.g., the plurality of light reflection blocking layers 1280 in FIG. 12) according to various embodiments of the disclosure may be provided. As an embodiment, the light reflection blocking layers 1500 may be provided by laminating a plurality of layers using a LTPS or LTPO process that forms a TFT (e.g., the TFTs 1250 in FIG. 12).

According to an embodiment, the light reflection blocking layers 1500 (e.g., the plurality of light reflection blocking layers 1280 of FIG. 12) may include a substrate 1510, a first oxide film 1520, a first nitride film 1530, a second oxide film 1540, a second nitride film 1550, a first silicon film 1560, a third oxide film 1570, a second silicon film 1580, and a metal layer 1590. For example, the light reflection blocking layers 1500 may include a plurality of layers and have a light reflectance of about 5.9%.

As an embodiment, the first oxide film 1520 may include a silicon oxide film ($SiO_2$). As an example, the first oxide film 1520 may have a thickness of about 1690 angstroms (Å).

As an embodiment, the first nitride film 1530 may include a silicon nitride film ($SiN_x$). As an example, the first nitride film 1530 may have a thickness of about 1210 angstroms (Å).

As an embodiment, the second oxide film 1540 may include a silicon oxide film ($SiO_2$). As an example, the second oxide film 1540 may have a thickness of about 870 angstroms (Å).

As an embodiment, the second nitride film 1550 may include a silicon nitride film ($SiN_x$). As an example, the second nitride film 1550 may have a thickness of about 520 angstroms (Å).

As an embodiment, the first silicon film 1560 may include amorphous silicon (a-Si). The first silicon film 1560 may have a thickness of about 620 Angstroms (Å).

As an embodiment, the third oxide film 1570 may include a silicon oxide film ($SiO_2$). As an example, the third oxide film 1570 may have a thickness of about 870 angstroms (Å).

As an embodiment, the second silicon film 1580 may include amorphous silicon (a-Si). The second silicon film 1580 may have a thickness of about 290 angstroms (Å).

As an embodiment, the metal layer 1590 may include molybdenum (Mo) or a molybdenum (Mo) alloy. As an example, the metal layer 1590 may have a thickness of about 800 angstroms (Å).

An electronic device according to various embodiments of the disclosure (e.g., the electronic device 200 in FIGS. 2A and 2B, the electronic device 300 in FIGS. 3A and 3B, the electronic device 400 in FIG. 4, the electronic device 500 in FIG. 5, or the electronic device 600 in FIG. 6) may include a display panel (e.g., the display panel 520 in FIG. 5, the display panel 800 in FIG. 8, the display panel 900 in FIG. 9, the display panel 1000 in FIG. 10, the display panel 1100 of FIG. 11, or the display panel 1200 in FIG. 12) and a camera module (e.g., the camera module 510 of FIG. 5) disposed under the display panel 520, 800, 900, 1000, 1100, or 1200. The display panels 520, 800, 900, 1000, 1100, or 1200 may include a first area (e.g., the first area 611 in FIGS. 5 and 6, the first area 1001 in FIG. 10, the first area 1101 in FIG. 11, the first area 1201 of FIG. 12) having a first pixel density and overlapping the camera module 510, a second area (e.g., the second area 612 in FIGS. 5 and 6, the second area 1002 in FIG. 10, the second area 1102 in FIG. 11, or the second area 1202 in FIG. 12) having a second pixel density greater than the first pixel density, a first light reflection blocking layer (e.g., the first light reflection blocking layer 1180 in FIG. 10, the first light reflection blocking layer 1180 in FIG. 11, or the light reflection blocking layer 1280 in FIG. 12) arranged all or at least a portion of the first area 611, 1001, 1101, or 1201, and a plurality of transparent wiring lines (e.g., the transparent wiring lines 1030 of FIG. 10, the transparent wiring lines 1130 of FIG. 11, or the transparent wiring lines 1230 in FIG. 12) arranged under first organic light-emitting diodes (e.g., the first OLEDs 1071 in FIG. 10, the first OLEDs 1171 in FIG. 11, or the first OLEDs 1271 in FIG. 12) arranged in the first area 611, 1001, 1101, or 1201. The first light reflection blocking layer 1180 or 1280 may be arranged to overlap the lower portions of the first organic light-emitting diodes 1071, 1171, or 1271 arranged in the first area 611, 1001, 1101, or 1201. The first light reflection blocking layer 1180 or 1280 may be arranged between the anode electrodes (e.g., the anode electrodes 1171*a* in FIG. 11, the anode electrodes 1271*a* in FIG. 12) of the first organic light-emitting diodes 1071, 1171, or 1271 and the plurality of transparent wiring lines 1030, 1130, or 1230.

According to an embodiment, the first light reflection blocking layers 1180 and 1280 may be arranged under the anode electrodes 1171*a* or 1271*a* of the first organic light emitting diodes 1071, 1171, or 1271.

According to an embodiment, the first light reflection blocking layer 1180 or 1280 may be arranged on at least one layer located under the anode electrodes 1171*a* or 1271*a*.

According to an embodiment, the electronic device 200, 300, 400, 500, or 600 according to various embodiments of the disclosure may include a plurality of first driving circuits 1050, 1150, or 1250 configured to drive the first organic light-emitting diodes 1071, 1171, or 1271. The plurality of transparent wiring lines 1030, 1130, or 1230 may electrically interconnect the first organic light-emitting diodes 1071, 1171, or 1271 and the plurality of first driving circuits (e.g., the plurality of TFTs 1050 in FIG. 10, the plurality of TFTs 1150 in FIG. 11, or the plurality of TFTs 1250 in FIG. 12).

According to an embodiment, the first light reflection blocking layer 1180 or 1280 may have the same width as a first width of the anode electrodes 1171*a* or 1271*a*, or may have a second width greater than the first width of the anode electrodes 1171*a* or 1271*a*.

According to an embodiment, the first light reflection blocking layer 1180 or 1280 may be provided to have a greater width as the first light reflection blocking layer is disposed farther from the lower portions of the anode electrodes 1171*a* or 1271*a*.

According to an embodiment, the first light reflection blocking layer 1180 or 1280 may include an opaque organic material.

According to an embodiment, the first light reflection blocking layer 1180 or 1280 may include a black PDL.

According to an embodiment, the first light reflection blocking layer 1180 or 1280 may have a light reflectance of 4% or less.

According to an embodiment, a second light reflection blocking layer (e.g., the second light reflection blocking layer 1190 in FIG. 11) arranged in at least a portion of the second area 612, 1002, 1102, or 1202 may be included.

According to an embodiment, the second light reflection blocking layer 1190 may be arranged under the anode electrodes 1172*a* or 1272*a* of a plurality of second organic light-emitting diodes (e.g., the second OLEDs 1072 in FIG. 10, the second OLEDs 1172 in FIG. 11, or the second OLEDs 1272 in FIG. 12) of a plurality of pixels provided in the second area 612, 1002, 1102, or 1202.

According to an embodiment, the second area 612, 1002, 1102, or 1202 may include a plurality of first driving circuits 1050, 1150, or 1250 which drive the first organic light emitting diodes 1071, 1171, or 1271, and a plurality of second driving circuits which drive the second organic light-emitting diodes 1072, 1172, or 1272.

According to an embodiment, the second light reflection blocking layer 1190 may be arranged on the plurality of first driving circuits 1050, 1150, or 1250 and the plurality of second driving circuits.

According to an embodiment, the second light reflection blocking layer 1190 may include an opaque organic material.

According to an embodiment, the second light reflection blocking layer 1190 may include a black PDL.

According to an embodiment, the second light reflection blocking layer 1190 may have a light reflectance of 4% or less.

According to an embodiment, the electronic device 200, 300, 400, 500, or 600 according to various embodiments of the disclosure may include a bottom metal layer (e.g., the bottom metal layer 1260 in FIG. 12) arranged in at least a portion of the second area 612, 1002, 1102, or 1202. The first light reflection blocking layer 1180 or 1280 may be disposed at substantially the same height as the bottom metal layer 1260 in the first area 611, 1001, 1101, or 1201.

According to an embodiment, the first light reflection blocking layer 1180 or 1280 may include at least one metal layer and at least one non-metal layer.

According to an embodiment, the first light reflection blocking layer 1180 or 1280 may include one titanium metal layer and have a reflectance of 5.2% or less, or may include a plurality of titanium metal layers and have a reflectance 4.4% or less.

According to an embodiment, the first light reflection blocking layer 1180 or 1280 may include one molybdenum metal layer and have a reflectance of 5.9% or less.

An electronic device (e.g., the electronic device 200 in FIGS. 2A and 2B, the electronic device 300 in FIGS. 3A and 3B, the electronic device 400 in FIG. 4, the electronic device in FIG. 5, or the electronic device 600 in FIG. 6) according to various embodiments of the disclosure may include a display panel 520, 800, 900, 1000, 1100, or 1200 and a camera module 510 arranged under the display panel 520, 800, 900, 1000, 1100, or 1200. The display panel 520, 800, 900, 1000, 1100, or 1200 may include a first area 611, 1001, 1101, or 1201 having a first pixel density and overlapping the camera module 510, a second area 612, 1002, 1102, or 1202 having a second pixel density greater than the first pixel density, a first light reflection blocking layer 1180 or 1280 arranged in all or at least a portion of the first area 611, 1001, 1101, or 1201, a second light reflection blocking layer 1190 arranged in all or at least a portion of the second area 612, 1002, 1102, or 1202, and a plurality of transparent wiring lines 1030, 1130, or 1230 arranged under the first organic light emitting diodes 1071, 1171, or 1271 arranged in the first area 611, 1001, 1101, or 1201. The first light reflection blocking layer 1180 or 1280 may be arranged to overlap the lower portions of the first organic light-emitting diodes 1071, 1171, or 1271 arranged in the first area 611, 1001, 1101, or 1201. The first light reflection blocking layer 1180 or 1280 may be arranged between the anode electrodes 1171a or 1271a of the first organic light-emitting diodes 1071, 1171, or 1271 and the plurality of transparent wire lines 1030, 1130, or 1230. The second light reflection blocking layer 1190 may be provided to extend to at least a portion of the first area 611, 1001, 1101, or 1201.

According to an embodiment, the second light reflection blocking layer 1190 may be provided to overlap an anode electrode disposed at the outermost of the plurality of anode electrodes 1171a or 1271a provided in the first area 611, 1001, 1101, or 1201.

According to an embodiment, the second light reflection blocking layer 1190 may be provided under an anode electrode 1171a or 1271a disposed at the outermost of the plurality of anode electrodes 1171a or 1271a provided in the first area 611, 1001, 1101, or 1201.

According to an embodiment, the first light reflection blocking layer 1180 or 1280 may include an opaque organic material.

According to an embodiment, the first light reflection blocking layer 1180 or 1280 may have a light reflectance of 4% or less.

According to an embodiment, the second light reflection blocking layer 1190 may include an opaque organic material.

According to an embodiment, the second light reflection blocking layer 1190 may have a light reflectance of 4% or less.

While the disclosure has been shown and described with reference to various embodiments thereof, it will be understood by those skilled in the art that various changes in form and details may be made therein without departing from the spirit and scope of the disclosure as defined by the appended claims and their equivalents.

The invention claimed is:

1. An electronic device comprising:
  a display panel; and
  camera circuitry arranged under the display panel,
  wherein the display panel includes:
    a first area including a first plurality of pixels having a first pixel density and overlapping the camera circuitry,
    a second area including a second plurality of pixels having a second pixel density greater than the first pixel density,
    a first light reflection blocking layer arranged in all or at least a portion of the first area, and
    a plurality of transparent wiring lines arranged under first organic light-emitting diodes arranged in the first area,
  wherein the first light reflection blocking layer is arranged to overlap lower portions of the first organic light-emitting diodes arranged in the first area, and
  wherein the first light reflection blocking layer is arranged between anode electrodes of the first organic light-emitting diodes and the plurality of transparent wiring lines.

2. The electronic device of claim 1, wherein the first light reflection blocking layer is arranged under the anode electrodes of the first organic light-emitting diodes.

3. The electronic device of claim 2, wherein the first light reflection blocking layer is arranged on at least one layer located under the anode electrodes of the first organic light-emitting diodes.

4. The electronic device of claim 2, further comprising:
  a plurality of first driving circuits configured to drive the first organic light-emitting diodes,
  wherein the plurality of transparent wiring lines electrically interconnect the first organic light-emitting diodes and the plurality of first driving circuits.

5. The electronic device of claim 2, wherein the first light reflection blocking layer has a width equal to a first width of the anode electrodes of the first organic light-emitting diodes, or has a second width greater than the first width of the anode electrodes of the first organic light-emitting diodes.

6. The electronic device of claim 5, wherein a width of the first light reflection blocking layer increases in a direction from lower portions of the anode electrodes of the first organic light-emitting diodes toward the plurality of transparent wiring lines.

7. The electronic device of claim 1, wherein the first light reflection blocking layer includes an opaque organic material.

8. The electronic device of claim 1, wherein the first light reflection blocking layer includes a black pixel define layer.

9. The electronic device of claim 1, wherein the first light reflection blocking layer has a light reflectance of 4% or less.

10. The electronic device of claim 1, further comprising:
  a second light reflection blocking layer arranged in at least a portion of the second area.

11. The electronic device of claim 10, wherein the second light reflection blocking layer is arranged under anode electrodes of second organic light-emitting diodes arranged in the second area.

12. The electronic device of claim 10, wherein the second area includes:
  a plurality of first driving circuits configured to drive the first organic light-emitting diodes; and
  a plurality of second driving circuits configured to drive second organic light-emitting diodes.

13. The electronic device of claim 12, wherein the second light reflection blocking layer is arranged above the plurality of first driving circuits and the plurality of second driving circuits.

14. The electronic device of claim 13, wherein the second light reflection blocking layer includes an opaque organic material.

15. The electronic device of claim 13, wherein the second light reflection blocking layer includes a black pixel define layer.

16. The electronic device of claim 13, wherein the second light reflection blocking layer has a light reflectance of 4% or less.

17. The electronic device of claim 13, further comprising:
a bottom metal layer arranged in at least a portion of the second area,
wherein the first light reflection blocking layer is arranged at a height substantially equal to a height of the bottom metal layer in the first area.

18. The electronic device of claim 17, wherein the first light reflection blocking layer includes at least one metal layer and at least one non-metal layer.

19. The electronic device of claim 18, wherein the first light reflection blocking layer includes one titanium metal layer and has a reflectance of 5.2% or less, or includes a plurality of titanium metal layers and has a reflectance of 4.4% or less.

20. The electronic device of claim 18, wherein the first light reflection blocking layer includes one molybdenum metal layer and has a reflectance of 5.9% or less.

* * * * *